United States Patent
Suzuki et al.

(10) Patent No.: US 7,745,252 B2
(45) Date of Patent: Jun. 29, 2010

(54) SEMICONDUCTOR DEVICE AND MANUFACTURING METHOD THEREOF

(75) Inventors: Tsunenori Suzuki, Kanagawa (JP); Ryoji Nomura, Kanagawa (JP); Mikio Yukawa, Kanagawa (JP); Nobuharu Ohsawa, Kanagawa (JP); Tamae Takano, Kanagawa (JP); Yoshinobu Asami, Kanagawa (JP); Takehisa Sato, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 395 days.

(21) Appl. No.: 11/510,396

(22) Filed: Aug. 25, 2006

(65) Prior Publication Data

US 2007/0048970 A1    Mar. 1, 2007

(30) Foreign Application Priority Data

Aug. 31, 2005  (JP) .............................. 2005-252876

(51) Int. Cl.
 *H01L 21/00* (2006.01)
(52) U.S. Cl. ................ 438/82; 438/99; 438/623; 438/780; 257/40; 257/459; 257/642; 257/E51.011; 257/E51.015; 257/E51.018; 257/E25.009; 257/E21.122
(58) Field of Classification Search ............. 438/82, 438/99, 106, 118, 406, 455, 623, 780, 789, 438/FOR. 135; 257/40, 459, 642, 676, 786, 257/E51.011, E51.015, E51.018, E31.004, 257/E25.009, E23.02, E23.023, E21.122
See application file for complete search history.

(56) References Cited

U.S. PATENT DOCUMENTS 5,621,246 A   4/1997   Motoyama (Continued)

FOREIGN PATENT DOCUMENTS

CN    1397984 A    2/2003

(Continued)

OTHER PUBLICATIONS

European Search Report re application No. 06016936.4, dated Nov. 28, 2006.

(Continued)

*Primary Examiner*—N Drew Richards
*Assistant Examiner*—Yu-Hsi Sun
(74) *Attorney, Agent, or Firm*—Husch Blackwell Sanders LLP

(57) ABSTRACT

It is an object of the present invention to manufacture, with high yield, a semiconductor device in which an element that has a layer containing an organic compound is provided over a flexible substrate. A method for manufacturing a semiconductor device includes: forming a separation layer over a substrate; forming an element-formed layer over the separation layer by forming an inorganic compound layer, a first conductive layer, and a layer containing an organic compound and forming a second conductive layer which is in contact with the layer containing an organic compound and the inorganic compound layer; and separating the separation layer and the element-formed layer from each other after pasting a first flexible substrate over the second conductive layer.

28 Claims, 21 Drawing Sheets

U.S. PATENT DOCUMENTS

| | | |
|---|---|---|
| 6,236,587 B1 | 5/2001 | Gudesen et al. |
| 6,380,597 B1 | 4/2002 | Gudesen et al. |
| 6,947,321 B2 | 9/2005 | Tanabe |
| 2003/0032210 A1 | 2/2003 | Takayama et al. |
| 2003/0222575 A1 | 12/2003 | Yamazaki et al. |
| 2004/0087110 A1 | 5/2004 | Takayama et al. |
| 2004/0232413 A1 | 11/2004 | Yamazaki et al. |
| 2004/0232943 A1 | 11/2004 | Sheats et al. |
| 2005/0008894 A1 | 1/2005 | Hiruma et al. |
| 2005/0183769 A1* | 8/2005 | Nakagawa et al. .......... 136/263 |
| 2005/0233230 A1* | 10/2005 | Carmichael et al. ........... 430/56 |
| 2005/0242720 A1* | 11/2005 | Sano et al. .................. 313/506 |
| 2007/0080627 A1* | 4/2007 | Sakamoto ................... 313/504 |

FOREIGN PATENT DOCUMENTS

| | | |
|---|---|---|
| EP | 1381054 A1 | 1/2004 |
| JP | 07-030012 | 1/1995 |
| JP | 2003-174153 | 6/2003 |
| JP | 2004-047791 | 2/2004 |
| WO | WO 2004/061906 A2 | 7/2004 |

OTHER PUBLICATIONS

Office Action re Chinese application No. CN 200610129024.2, dated Sep. 11, 2009 (with English translation).

* cited by examiner

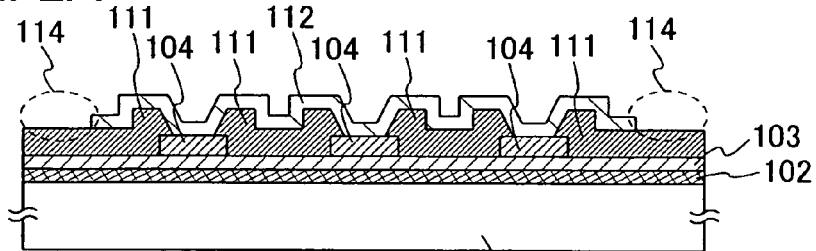
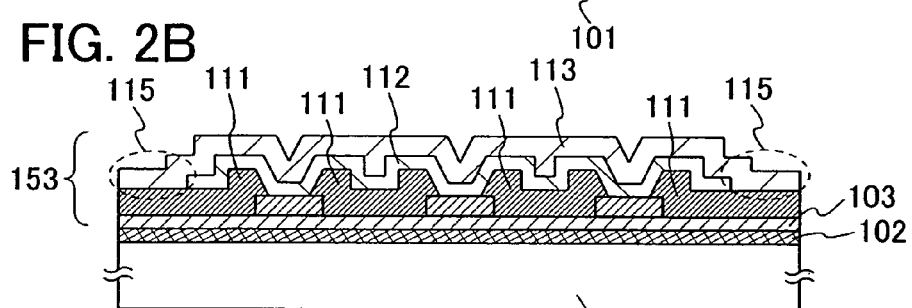
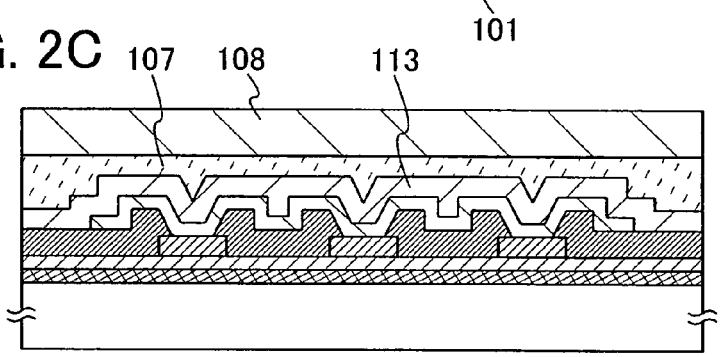
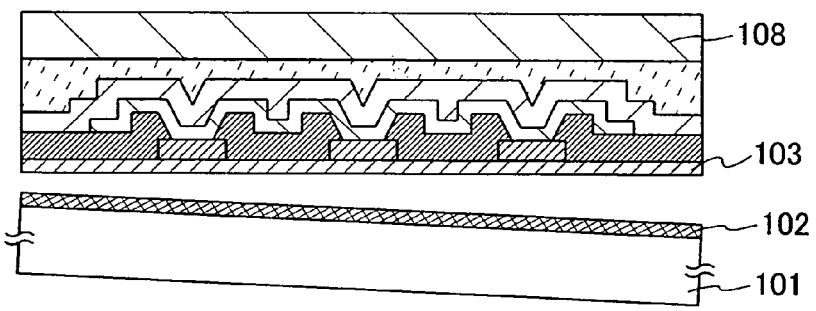
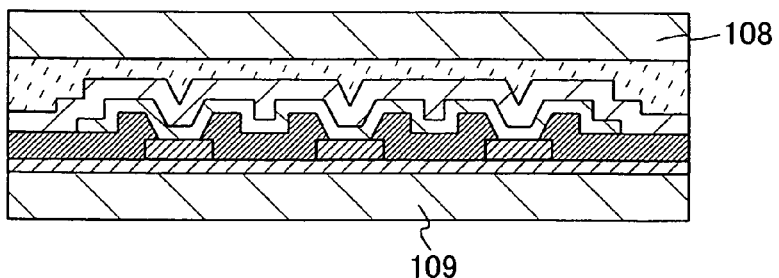

SEMICONDUCTOR DEVICE AND MANUFACTURING METHOD THEREOF

BACKGROUND OF THE INVENTION

1. Field of Invention

The present invention relates to a semiconductor device provided with an element which has a layer containing an organic compound over a flexible substrate, and also relates to a manufacturing method of the semiconductor device.

2. Description of the Related Art

It has been required to manufacture semiconductor devices at low cost, and development has been extensively carried out in recent years on elements such as transistors, memories, and solar cells which use layers containing organic compounds for control circuits, storage circuits, or the like (see, for example, Reference 1: Japanese Patent Laid-Open No. 2004-47791).

Various applications of semiconductor devices having the elements such as transistors, memories, and solar cells which use the layers containing organic compounds are expected, and using flexible plastic films is attempted in pursuit of reduction in size and weight.

Since plastic films have low heat resistance, it is necessary to decrease the highest temperature in a process. Therefore, the semiconductor devices using plastic films are manufactured by an evaporation method or a sputtering method using a metal mask.

Since plastic films have low heat resistance, transistors formed over plastic films cannot have as favorable electrical characteristics as transistors formed over glass substrates at present.

Consequently, such a technique is suggested that minute elements formed over a glass substrate by a photolithography step are separated from the substrate and pasted to another base material such as a plastic film (see Reference 2: Japanese Patent Laid-Open No. 2003-174153).

However, in the case of manufacturing a semiconductor device by an evaporating method or a sputtering method using a metal mask, a step of aligning the metal mask is necessary. Therefore, a problem in aligning the metal mask leads to low yield.

Moreover, in the case of manufacturing a semiconductor device by an evaporation method or a sputtering method using a metal mask, an element is designed in consideration of the misalignment. Thus, it is difficult to manufacture transistors, memories, and solar cells having minute structures, and reduction in size and weight and improvement in performance of semiconductor devices are difficult.

Moreover, in the case of separating an element which has a layer containing an organic compound, by using a separation step shown in Reference 2; specifically, in the case of forming a separation layer 102 over a substrate 101, forming an inorganic insulating layer 103 over the separation layer 102, forming a first electrode layer 104 over the inorganic insulating layer 103, forming a layer 105 containing an organic compound over the first electrode layer 104, forming a second electrode layer 106 over the layer 105 containing an organic compound, and separating an element 151 which has the layer 105 containing an organic compound and a layer 157 having the element 151 as shown in FIG. 21, there is a problem in that the separation occurs between the layer 105 containing an organic compound and the second electrode layer 106.

This is because adhesion between the layer 105 containing an organic compound and the second electrode layer 106 is low. Specifically, since the layer 105 containing an organic compound functions as an organic semiconductor, the layer 105 is formed with a material having a carrier-transporting property. The material having a carrier-transporting property does not have in general a polar substituent such as an imide group, a cyano group, or a hydroxyl group. Accordingly, the adhesion between the layer 105 containing an organic compound and the second electrode layer 106 is so low that separation occurs between the layer 105 containing an organic compound and the second electrode layer 106 in a separation step.

As a result, it is difficult to manufacture, with high yield, a semiconductor device where the element which has the layer containing an organic compound is provided over a plastic film.

SUMMARY OF THE INVENTION

In view of the above problem, it is an object of the present invention to manufacture, with high yield, a semiconductor device where an element which has a layer containing an organic compound is provided over a flexible substrate.

According to the present invention, a region having low adhesion is formed over a substrate having a separation layer, and a region having high adhesion is formed so as to surround an outer edge of the region having low adhesion, when the substrate is viewed from above. In a cross section of the region having low adhesion, for example, an inorganic compound layer is in contact with a layer containing an organic compound not having a polar substituent such as an imide group, a cyano group, or a hydroxyl group; on the other hand, in a cross section of the region having high adhesion, a plurality of inorganic compound layers are in contact with each other. A region 503 having high adhesion may surround an outer edge of a region 502 having low adhesion as exemplified in FIG. 13A. Moreover, as FIG. 13B shows an example, the region 503 having high adhesion may be discontinuously formed so as to surround the outer edge of the region 502 having low adhesion. Moreover, as FIG. 13C shows an example, the region 503 having high adhesion with a rectangular shape may be formed in accordance with each side of the region 502 having low adhesion. The region having high adhesion can have various shapes such as a rectangular shape, a circular shape, an elliptical shape, a curved shape, or the like.

Moreover according to the present invention, after forming, over a substrate having a separation layer 501, an element-formed layer in which the region 502 having low adhesion is formed and the region 503 having high adhesion is formed so as to surround the outer edge of the region 502, the substrate and the element-formed layer are separated from each other at the separation layer and the element-formed layer is attached to a flexible substrate.

According to the present invention, a method for manufacturing a semiconductor device includes: forming a separation layer over a substrate; forming an element-formed layer by forming an inorganic compound layer, a first conductive layer, and a layer containing an organic compound over the separation layer, and forming a second conductive layer in contact with the layer containing an organic compound and the inorganic compound layer; and after attaching a first flexible substrate over the second conductive layer, separating the substrate and the element-formed layer from each other at the separation layer.

According to the present invention, a semiconductor device includes a flexible substrate, an inorganic compound layer, a layer containing an organic compound, and a conductive layer which is in contact with the layer containing an organic compound as well as the inorganic compound layer.

The inorganic compound layer is an insulating layer or a conductive layer. Moreover, the inorganic compound layer may function as an interlayer insulating layer or a connection layer.

The layer containing an organic compound and the conductive layer which is in contact with the layer containing an organic compound constitute parts of a storage element or a light-emitting element.

Moreover, the present invention includes the following.

According to the present invention, a method for manufacturing a semiconductor device includes: forming a separation layer over a substrate; forming an element-formed layer by forming an inorganic compound layer, a first conductive layer, and a layer containing an organic compound over the separation layer, and forming a second conductive layer that is in contact with the layer containing an organic compound and the inorganic compound layer; and after attaching a first flexible substrate over the second conductive layer, separating the substrate and the element-formed layer from each other at the separation layer.

According to the present invention, a method for manufacturing a semiconductor device includes: forming a separation layer over a substrate; forming an element-formed layer by forming an inorganic insulating layer over the separation layer, forming a first electrode layer over the inorganic insulating layer, forming a layer containing an organic compound over a part of the inorganic insulating layer and the first electrode layer, forming a second electrode layer that is in contact with the layer containing an organic compound and the inorganic insulating layer; and after attaching a first flexible substrate over the second electrode layer, separating the substrate and the element-formed layer from each other at the separation layer.

According to the present invention, a method for manufacturing a semiconductor device includes: forming a separation layer over a substrate; forming an element-formed layer by forming an insulating layer over the separation layer, forming a first electrode layer over the insulating layer, forming an inorganic insulating layer which covers an edge portion of the first electrode layer, forming a layer containing an organic compound over a part of the inorganic insulating layer and an exposed portion of the first electrode layer, and forming a second electrode layer that is in contact with the layer containing an organic compound and the inorganic insulating layer; and after attaching a first flexible substrate over the second electrode layer, separating the substrate and the element-formed layer from each other at the separation layer.

According to the present invention, a method for manufacturing a semiconductor device includes: forming a separation layer over a substrate; forming an element-formed layer by forming an inorganic insulating layer over the separation layer, forming a first electrode layer over the inorganic insulating layer, forming an organic insulating layer over the first electrode layer, exposing partially the first electrode layer and the inorganic insulating layer by selectively etching the organic insulating layer, forming a layer containing an organic compound over a part of the organic insulating layer and an exposed portion of the first electrode layer, and forming a second electrode layer that is in contact with the layer containing an organic compound and the inorganic insulating layer; and after attaching a first flexible substrate over the second electrode layer, separating the substrate and the element-formed layer from each other at the separation layer.

According to the present invention, a method for manufacturing a semiconductor device includes: forming a separation layer over a substrate; forming an element-formed layer by forming an insulating layer over the separation layer, forming a first electrode layer and a conductive layer over the insulating layer, forming an organic insulating layer over the first electrode layer and the conductive layer, exposing partially the first electrode layer and the conductive layer by selectively etching the organic insulating layer, forming a layer containing an organic compound over a part of the organic insulating layer and an exposed portion of the first electrode layer, and forming a second electrode layer that is in contact with the layer containing an organic compound and the conductive layer; and after attaching a first flexible substrate over the second electrode layer, separating the insulating layer from the substrate at the separation layer.

It is to be noted that after separating the element-formed layer and the separation layer from each other, the element-formed layer may be attached to a second flexible substrate.

According to the present invention, a semiconductor device includes an inorganic insulating layer formed over a first flexible substrate; a first electrode layer formed over the inorganic insulating layer; a layer containing an organic compound formed over a part of the inorganic insulating layer and the first electrode layer; a second electrode layer which is in contact with the layer containing an organic compound and the inorganic insulating layer; and a second flexible substrate formed over the second electrode layer.

According to the present invention, a semiconductor device includes an insulating layer formed over a first flexible substrate; a first electrode layer formed over the insulating layer; an inorganic insulating layer which covers an edge portion of the first electrode layer; a layer containing an organic compound formed over a part of the inorganic insulating layer and the first electrode layer; a second electrode layer which is in contact with the layer containing an organic compound and the inorganic insulating layer; and a second flexible substrate formed over the second electrode layer.

According to the present invention, a semiconductor device includes an insulating layer formed over a first flexible substrate; a first electrode layer and a conductive layer which are formed over the insulating layer; an organic insulating layer which covers edge portions of the first electrode layer and the conductive layer; a layer containing an organic compound formed over the organic insulating layer and the first electrode layer; a second electrode layer which is in contact with the layer containing an organic compound and the conductive layer; and a second flexible substrate formed over the second electrode layer.

It is to be noted that the first electrode layer, the layer containing an organic compound, and the second electrode layer constitute parts of a storage element, a light-emitting element, a photoelectric conversion element, a solar cell, or a transistor.

In the present invention, the adhesion between the inorganic compound layer and the conductive layer is higher than that between the layer containing an organic compound and the conductive layer; therefore, separation is difficult to occur at an interface between the inorganic compound layer and the conductive layer in a separation step. Thus, separation at an interface between the conductive layer and the layer containing an organic compound can be prevented by forming a region having low adhesion and a region having high adhesion so as to surround an outer edge of the region having low adhesion when viewed from above. Moreover, it is possible to separate, with high yield, a layer which has an element that has a layer containing an organic compound formed over a substrate, typically a storage element, a light-emitting element, a photoelectric conversion element, a solar cell, or a transistor. Further, a semiconductor device in which an element which has a layer containing an organic compound is provided over a flexible substrate can be manufactured with high yield.

In the semiconductor device of the present invention, the inorganic compound layer and the conductive layer have the layer containing an organic compound and the organic insulating layer sandwiched therebetween, and moreover, have a number of regions where the inorganic compound is in contact with the conductive layer. This makes it possible to decrease regions where the layer containing an organic compound and the organic insulating layer are exposed to the air, to suppress intrusion of moisture, oxygen, and the like into these regions, and to decrease deterioration of the semiconductor device.

Since a semiconductor device in which an element which has the layer containing an organic compound is provided over a flexible substrate can be obtained, a thin and lightweight semiconductor device can be obtained.

BRIEF DESCRIPTION OF THE DRAWINGS

In the accompanying drawings:

FIGS. 2A to 2E are cross-sectional views describing manufacturing steps of a semiconductor device of the present invention;

DETAILED DESCRIPTION OF THE INVENTION

Figure 1A:
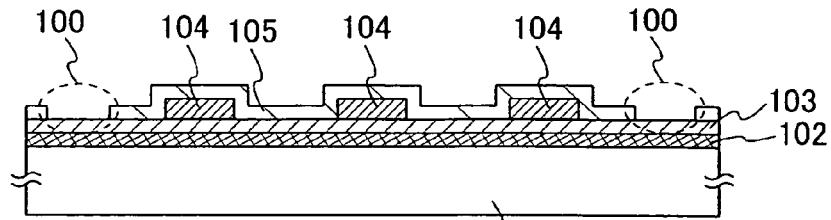
FIGS. 1A to 1E are cross-sectional views describing manufacturing steps of a semiconductor device of the present invention.

Embodiment modes and embodiments will hereinafter be described with reference to the accompanying drawings. However, the present invention is not restricted to the following description, and it is easily understood by those skilled in the art that the mode and detail can be variously changed without departing from the scope and spirit of the present invention. Therefore, the present invention is not restricted to the description of the embodiment modes and embodiments hereinafter shown. It is to be noted that, in the structure of the present invention hereinafter described, the reference numeral indicating the same part is used in common throughout the drawings.

Embodiment Mode 1

With reference to FIGS. 1A to 1E, this embodiment mode will describe a method for separating, with high yield, an element which has a layer containing an organic compound between a pair of electrodes and an element-formed layer having the element.

As shown in FIG. 1A, a separation layer 102 is formed over a substrate 101, and an inorganic insulating layer 103 is formed over the separation layer 102. Next, a first electrode layer 104 is formed over the inorganic insulating layer 103, and a layer 105 containing an organic compound is formed over the first electrode layer 104 and the inorganic insulating layer 103. In FIG. 1A, a region 100 is a region where the inorganic insulating layer 103 is exposed. The layer 105 containing an organic compound is formed into a pattern having an opening portion by using a metal mask so that the inorganic insulating layer 103 is partially exposed at the opening portion. Alternatively, after forming the layer 105 containing an organic compound over the first electrode layer 104 and the inorganic insulating layer 103, the layer 105 containing an organic compound is partially etched to partially expose the inorganic insulating layer 103.

As the substrate 101, a glass substrate, a quartz substrate, a metal or stainless steel substrate with an insulating layer formed over one surface thereof, a plastic substrate having heat resistance enough to resist process temperature of the steps, or the like can be used. Since the aforementioned substrate 101 is not restricted in size and shape, for example, a rectangular substrate with a length of 1 m or more on a side can be used as the substrate 101. With such a rectangular substrate, productivity can be drastically increased. This is a superior point to a circular silicon substrate.

The separation layer 102 is formed in a single-layer or multilayer structure by a sputtering method, a plasma CVD method, a coating method, a printing method, or the like with an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si); an alloy material containing the element as its main component; or a compound material containing the element as its main component. A crystal structure of a layer containing silicon may be amorphous, microcrystal, or polycrystal. Here, a coating method is a method by which a film is formed by discharging a solution on an object to be processed and includes a spin coating method and a droplet discharging method. A droplet discharging method is a method of forming a predetermined pattern by discharging a droplet of a composition containing particulates from a small hole.

If the separation layer 102 has a single-layer structure, the separation layer 102 is preferably formed by using a layer containing tungsten, molybdenum, or a mixture of tungsten and molybdenum. Alternatively, a layer containing tungsten oxide or tungsten oxynitride, a layer containing molybdenum oxide or molybdenum oxynitride, or a layer containing an oxide or oxynitride of a mixture of tungsten and molybdenum is formed. A mixture of tungsten and molybdenum corresponds to, for example, an alloy of tungsten and molybdenum.

If the separation layer 102 has a multilayer structure, a layer containing tungsten, molybdenum, or a mixture of tungsten and molybdenum is formed as a first layer, and a layer containing any of the following is formed as a second layer: an oxide of tungsten, molybdenum, or a mixture of tungsten and molybdenum; a nitride of tungsten, molybdenum, or a mixture of tungsten and molybdenum; an oxynitride of tungsten, molybdenum, or a mixture of tungsten and molybdenum; and a nitride oxide of tungsten, molybdenum, or a mixture of tungsten and molybdenum.

If the separation layer 102 has a multilayer structure of a layer containing tungsten and a layer containing tungsten oxide, the layer containing tungsten is formed and then an insulating layer is formed with an oxide on the layer containing tungsten, thereby forming a layer containing tungsten oxide at an interface between the layer containing tungsten and the insulating layer. Moreover, a surface of the layer containing tungsten may be subjected to a treatment such as a thermal oxidation treatment, an oxygen plasma treatment, or a treatment using a solution having strong oxidizability such as ozone water, thereby forming the layer containing tungsten oxide. This similarly applies to the case of forming a layer containing tungsten nitride, tungsten oxynitride, or tungsten nitride oxide, and after forming a layer containing tungsten, a silicon nitride layer, a silicon oxynitride layer, or a silicon nitride oxide layer may be formed on the layer containing tungsten.

Tungsten oxide is represented by $WO_x$, where x ranges from 2 to 3. X may be 2 ($WO_2$), 2.5 ($W_2O_5$), 2.75 ($W_4O_{11}$), 3 ($WO_3$), and so on.

Although the separation layer 102 is formed so as to be in contact with the substrate 101 in the above step, the present invention is not restricted to this step. An insulating layer to be a base may be formed so as to be in contact with the substrate 101 and then the separation layer 102 may be provided so as to be in contact with the insulating layer.

The inorganic insulating layer 103 is formed with an inorganic compound in a single-layer or multilayer structure by a sputtering method, a plasma CVD method, a coating method, a printing method, or the like. As a typical example of the inorganic compound, oxidized silicon or nitrided silicon is given. As a typical example of oxidized silicon, silicon oxide, silicon oxynitride, silicon nitride oxide, or the like is given. As a typical example of nitrided silicon, silicon nitride, silicon oxynitride, silicon nitride oxide, or the like is given.

Moreover, the inorganic insulating layer 103 may have a multilayer structure. For example, a multilayer may be formed by using an inorganic compound. Typically, the inorganic insulating layer 103 may be formed by stacking silicon oxide, silicon nitride oxide, and silicon oxynitride.

The first electrode layer 104 can be formed in a single-layer or multilayer structure by using a metal, alloy, compound, or the like having high conductivity by a sputtering method, a plasma CVD method, a coating method, a printing method, an electrolytic plating method, an electroless plating method, or the like. Typically, a metal, alloy, conductive compound, mixture thereof, or the like having a high work function (specifically 4.0 eV or higher) can be used. Moreover, a metal, alloy, conductive compound, mixture thereof, or the like having a low work function (specifically 3.8 eV or lower) can be used.

As a typical example of a metal, alloy, or conductive compound having a high work function (specifically 4.0 eV or higher), indium tin oxide (hereinafter called ITO), indium tin oxide containing silicon, indium oxide containing 2 to 20 atomic % of zinc oxide (ZnO), or the like is given. Moreover, titanium (Ti), gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride (TiN), tungsten nitride (WN), or molybdenum nitride (MoN)), or the like can be used.

As a typical example of a metal, alloy, or conductive compound having a low work function (specifically 3.8 eV or lower), a metal belonging to Group 1 or 2 of the periodic table of the elements, i.e., an alkali metal such as lithium (Li) or cesium (Cs), an alkaline earth metal such as magnesium (Mg), calcium (Ca), or strontium (Sr); aluminum (Al); an alloy containing any of these (such as MgAg or AlLi); a rare earth metal such as europium (Er) or ytterbium (Yb); an alloy containing the rare earth metal; or the like can be used.

If an electrode for injecting holes to the layer containing an organic compound, i.e., an anode is used for the first electrode layer 104 or the second electrode layer 106, it is preferable to use a material having a high work function. On the contrary, if an electrode for injecting electrons to the layer containing an organic compound, i.e., a cathode is used, it is preferable to use a material having a low work function.

The layer 105 containing an organic compound can be formed by an evaporation method, an electron beam evaporation method, a coating method, or the like. In the case of using the aforementioned manufacturing method to form the layer 105 containing an organic compound, the layer 105 containing an organic compound is formed into a pattern having the region 100 where the inorganic insulating layer 103 is partially exposed. Alternatively, after forming the layer 105 containing an organic compound on the surface of the inorganic insulating layer 103 and the first electrode layer 104, the layer 105 containing an organic compound may be selectively etched to form the region 100 where the inorganic insulating layer 103 is partially exposed.

Here, after forming a titanium film of 50 to 200 nm thick by a sputtering method, the titanium film is etched into a desired shape by a photolithography method, thereby forming the first electrode layer 104. Next, the layer containing an organic compound is formed with NPB by an evaporation method.

Figure 1B:
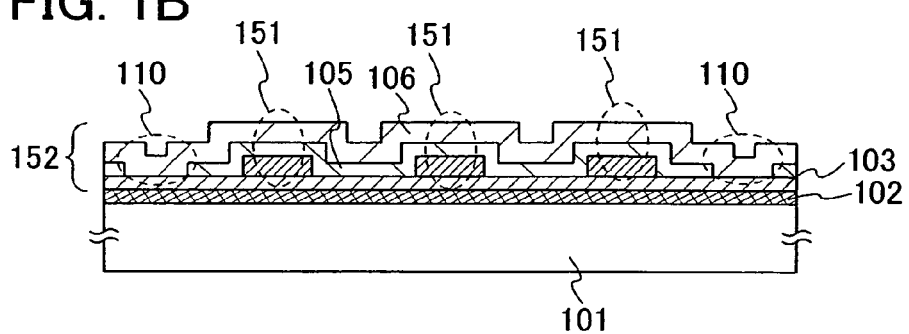

Next, as shown in FIG. 1B, the second electrode layer 106 is formed over the inorganic insulating layer 103 and the layer 105 containing an organic compound. Accordingly, a region 110 where the inorganic insulating layer 103 is in contact with the second electrode layer 106 can be formed. Moreover, by the first electrode layer 104, the layer 105 containing an organic compound, and the second electrode layer 106, an element 151 which has the layer containing an organic compound can be formed. The second electrode layer 106 can be formed by an evaporation method, a sputtering method, a CVD method, a printing method, a coating method, or the like. If the first electrode layer 104 is formed with a material having a high work function, the second electrode layer 106 is preferably formed with a material having a low work function. If the first electrode layer 104 is formed with a material having a low work function, the second electrode layer 106 is preferably formed with a material having a high work function.

Here, the second electrode layer 106 is formed by evaporating aluminum by an evaporation method.

It is to be noted here that a stack of the inorganic insulating layer 103 through the second electrode layer 106 is called an element-formed layer 152.

A more specific structure of the element 151 which has the layer containing an organic compound is hereinafter shown with reference to FIGS. 6A to 6E. It is to be noted that 205 in FIG. 6A corresponds to 105, a multilayer of 205 and 201 in FIG. 6B corresponds to 105, a multilayer of 205 and 202 in FIG. 6C corresponds to 105, a multilayer of 205 and 203 in FIG. 6D corresponds to 105, and a multilayer of 205, 245, and 244 corresponds to 105.

Figure 6A:
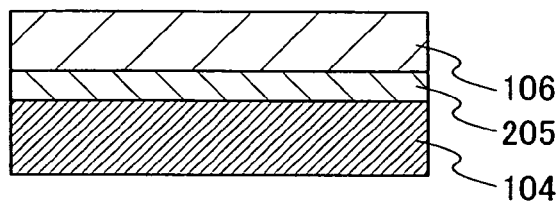
FIGS. 6A to 6E are cross-sectional views describing a structure of a storage element which can be applied to the present invention.

As shown in FIG. 6A, when a layer 205 containing an organic compound is formed to be a layer that changes in a crystal condition, conductivity, and a shape by applying voltage to the first electrode layer 104 and the second electrode layer 106, the element 151 which has the layer containing an organic compound functions as a storage element. The layer 205 containing an organic compound may be provided in a single-layer structure or a multilayer structure by stacking a plurality of layers formed with different organic compounds.

The thickness of the layer 205 containing an organic compound is preferably set so that the electrical resistance of the storage element changes by applying voltage to the first electrode layer 104 and the second electrode layer 106. The typical thickness of the layer 205 containing an organic compound ranges from 5 to 100 nm, preferably from 10 to 60 nm, and more preferably 10 to 30 nm.

The layer 205 containing an organic compound can be formed with an organic compound having a hole-transporting property or an organic compound having an electron-transporting property.

As the organic compound having a hole-transporting property, for example, phthalocyanine (abbreviation: $H_2Pc$), copper phthalocyanine (abbreviation: CuPc), and vanadyl phthalocyanine (VOPc) are given. Besides those, the following are given: 4,4',4"-tris(N,N-diphenylamino)triphenylamine (abbreviation: TDATA); 4,4',4"-tris[N-(3-methylphenyl)-N-phenylamino]triphenylamine (abbreviation: MTDATA); 1,3,5-tris[N,N-di(m-tolyl)amino]benzene (abbreviation: m-MTDAB); N,N'-diphenyl-N,N'-bis(3-methylphenyl)-1,1'-biphenyl-4,4'-diamine (abbreviation: TPD); 4,4'-bis[N-(1-naphthyl)-N-phenylamino]biphenyl (abbreviation: NPB); 4,4'-bis{N-[4-di(m-tolyl)amino]phenyl-N-phenylamino}biphenyl (abbreviation: DNTPD); 4,4'-bis[N-(4-biphenylyl)-N-phenylamino]biphenyl (abbreviation: BBPB); 4,4',4"-tri(N-carbazolyl)triphenylamine (abbreviation: TCTA); and the like. However, the present invention is not restricted to these. Among the aforementioned compounds, aromatic amine compounds typified by TDATA, MTDATA, m-MTDAB, TPD, DNTPD, BBPB, and TCTA are preferable as the organic compound because they easily generate holes. The substances mentioned here mainly have a hole mobility of $10^{-6}$ cm$^2$/Vs or higher.

As the organic compound having an electron-transporting property, the following metal complex having a quinoline skeleton or a benzoquinoline skeleton, or the like can be used: tris(8-quinolinolato)aluminum (abbreviation: Alq$_3$); tris(4-methyl-8-quinolinolato)aluminum (abbreviation: Almq$_3$); bis(10-hydroxybenzo[h]-quinolinato)beryllium (abbreviation: BeBq$_2$); bis(2-methyl-8-quinolinolato)-4-phenylphenolato-aluminum (BAlq); and the like. Besides those, the following metal complex having an oxazole-based ligand or a thiazole-based ligand, or the like can be used: bis[2-(2-hydroxyphenyl)benzoxazolato]zinc (abbreviation: Zn(BOX)$_2$); bis[2-(2-hydroxyphenyl)benzothiazolato]zinc (abbreviation: Zn(BTZ)$_2$); and the like. Furthermore, in addition to the metal complex, 2-(4-biphenylyl)-5-(4-tert-butylphenyl)-1,3,4-oxadiazole (abbreviation: PBD); 1,3-bis[5-(p-tert-butylphenyl)-1,3,4-oxadiazole-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); and the like can also be used. The substances mentioned here mainly have an electron mobility of $10^{-6}$ cm$^2$/Vs or higher.

Figure 6B:
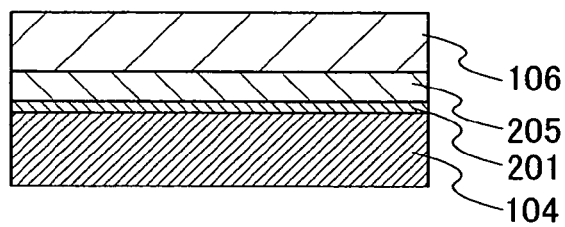

As shown in FIG. 6B, in the storage element, an insulating layer 201 may be formed between the first electrode layer 104 and the layer 205 containing an organic compound.

The insulating layer 201 is a layer for injecting charges of holes or electrons from the first electrode layer or the second electrode layer to the layer containing an organic compound, by a tunnel effect. The insulating layer 201 is formed to have the thickness capable of injecting charges to the layer 205 containing an organic compound by a tunnel effect at a predetermined voltage. The typical thickness of the insulating layer 201 ranges from 1 to 4 nm, preferably 1 to 2 nm. Since the insulating layer 201 is as thin as 1 to 4 nm, a tunnel effect occurs in the insulating layer 201, resulting in the increase in the charge-injecting property to the layer 205 containing an organic compound. Thus, if the insulating layer 201 is thicker than 4 nm, the tunnel effect does not occur in the insulating layer 201 and the electron injection into the layer 205 containing an organic compound gets difficult; thus, the applying voltage at the writing in the storage element increases. Moreover, since the insulating layer 201 is as thin as 1 to 4 nm, throughput improves.

The insulating layer 201 is formed with an inorganic compound or an organic compound that is stable thermally and chemically.

As typical examples of the inorganic compound that forms the insulating layer 201, the following oxides having an insulating property are given: $Li_2O$, $Na_2O$, $K_2O$, $Rb_2O$, BeO, MgO, CaO, SrO, BaO, $Sc_2O_3$, $ZrO_2$, $HfO_2$, $RfO_2$, $TaO_2$, $TcO_2$, $MnO_2$, $Fe_2O_3$, CoO, PdO, $Ag_2O$, $Al_2O_3$, $Ga_2O_3$, $Bi_2O_3$, and the like.

As other typical examples of the inorganic compound that forms the insulating layer 201, the following fluorides having an insulating property are given: LiF, NaF, KF, CsF, $BeF_2$, $MgF_2$, $CaF_2$, $SrF_2$, $BaF_2$, $AlF_3$, AgF, $MnF_3$, and the like. Moreover, the following chlorides having an insulating property are given: LiCl, NaCl, KCl, CsCl, $BeCl_2$, $CaCl_2$, $BaCl_2$, $AlCl_3$, $SnCl_4$, AgCl, $ZnCl_2$, $TiCl_4$, $TiCl_3$, $ZrCl_4$, $FeCl_3$, $PdCl_2$, $SbCl_3$, $SbCl_2$, $SrCl_2$, $TlC_3$, CuCl, $CuCl_2$, $MnCl_2$, $RuCl_2$, and the like. The following bromides having an insulating property are given: KBr, CsBr, AgBr, $BaBr_2$, LiBr, and the like. Furthermore, the following iodides having an insulating property are given: NaI, KI, $BaI_2$, $TlI_3$, AgI, $TiI_4$, $CaI_2$, $SiI_4$, CsI, and the like.

As other typical examples of the inorganic compound that forms the insulating layer 201, the following carbonates having an insulating property are given typically: $Li_2CO_3$, $K_2CO_3$, $Na_2CO_3$, $MgCO_3$, $CaCO_3$, $SrCO_3$, $BaCO_3$, $MnCO_3$, $FeCO_3$, $CoCO_3$, $NiCO_3$, $CuCO_3$, $Ag_2CO_3$, $ZnCO_3$, and the like. In addition, the following sulfates having an insulating property are given typically: $Li_2SO_4$, $K_2SO_4$, $Na_2SO_4$, $MgSO_4$, $CaSO_4$, $SrSO_4$, $BaSO_4$, $Ti_2(SO_4)_3$, $Zr(SO_4)_2$, $MnSO_4$, $FeSO_4$, $Fe_2(SO_4)_3$, $CoSO_4$, $Co_2(SO_4)_3$, $NiSO_4$, $CuSO_4$, $Ag_2SO_4$, $ZnSO_4$, $Al_2(SO_4)_3$, $In_2(SO_4)_3$, $SnSO_4$, $Sn(SO_4)_2$, $Sb_2(SO_4)_3$, $Bi_2(SO_4)_3$, and the like. In addition, the following nitrates having an insulating property are given typically: $LiNO_3$, $KNO_3$, $NaNO_3$, $Mg(NO_3)_2$, $Ca(NO_3)_2$, $Sr(NO_3)_2$, $Ba(NO_3)_2$, $Ti(NO_3)_4$, $Zr(NO_3)_4$, $Mn(NO_3)_2$, $Fe(NO_3)_2$, $Fe(NO_3)_3$, $Co(NO_3)_2$, $Ni(NO_3)_2$, $Cu(NO_3)_2$, $AgNO_3$, $Zn(NO_3)_2$, $Al(NO_3)_3$, $In(NO_3)_3$, $Sn(NO_3)_2$, and the like. Furthermore, nitrides having an insulating property, typified by AlN, SiN, and the like are given. The compositions of these inorganic compounds are not necessarily a strict integer ratio.

If the insulating layer 201 is formed with the inorganic compound, the thickness of the insulating layer is preferably in the range of 1 to 2 nm. When the insulating layer has the thickness of 3 nm or more, the voltage to be applied at the writing increases.

As typical examples of the organic compound that forms the insulating layer 201, organic resins typified by polyimide, acrylic, polyamide, benzocyclobutene, polyester, a novolac resin, a melamine resin, a phenol resin, an epoxy resin, a silicon resin, a furan resin, a diallylphthalate resin, and the like are given.

The insulating layer 201 can be formed by an evaporation method, an electron beam evaporation method, a sputtering method, a CVD method, or the like. Moreover, a spin coating method, a sol-gel method, a printing method, a droplet discharging method, or the like can be used.

Figure 6C:
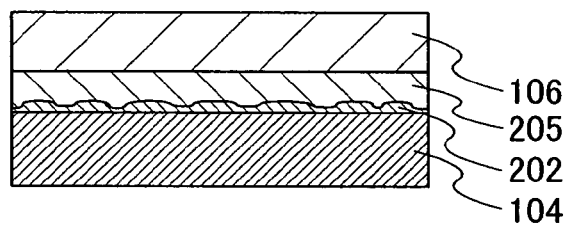

As shown in FIG. 6C, an insulating layer 202 having depression and projection, which is continuous may be used. However, in this case, it is preferable that the thickness of the insulating layer at the projection portion be in the range of 1 to 4 nm, preferably 2 to 4 nm, and that of the insulating layer at the depression portion be in the range of 0.1 nm to less than 2 nm, preferably 1 nm to less than 2 nm.

Figure 6D:
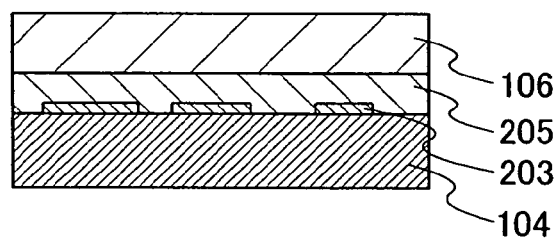

As shown in FIG. 6D, an insulating layer 203 dispersed over the first electrode layer 104, which is discontinuous may be provided. The discontinuous insulating layer 203 may have an island shape, a stripe shape, a net-like shape, or the like.

Moreover, insulating particles may be provided instead of the insulating layers 201 to 203. The insulating particles at this time have a grain size of 0.1 to 4 nm, preferably 1 to 4 nm.

Moreover, the insulating layers 201 to 203 or the insulating particles may be provided between the layer 205 containing an organic compound and the second electrode layer 106.

When the insulating layer with a thickness of 4 nm or less, preferably 2 nm or less, is provided between the first electrode layer 104 and the layer 205 containing an organic compound, or between the layer 205 containing an organic compound and the second electrode layer 106, a tunnel current flows to the insulating layer. Thus, it is possible to decrease unevenness in applied voltage and current value at writing in the storage element. Moreover, when the insulating layer with a thickness of 4 nm or less, preferably 2 nm or less, is provided between the first electrode layer 104 and the layer 205 containing an organic compound, or between the layer 205 containing an organic compound and the second electrode layer 106, a charge-injecting property due to the tunnel effect increases, whereby the layer 205 containing an organic compound can be made thicker. Thus, short-circuiting at an initial state can be prevented. Accordingly, the reliability of the storage device and the semiconductor device can be improved.

Figure 6E:
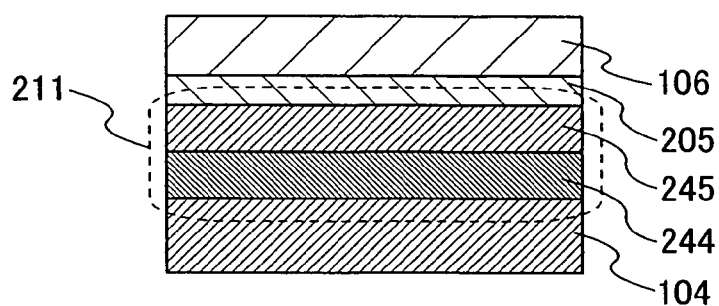

As a different structure from the aforementioned one, an element having a rectifying action may be provided between the first electrode layer 104 and the layer 205 having an organic compound, or between the second electrode layer 106 and the layer 205 containing an organic compound (FIG. 6E). As the element having a rectifying action, typically, a Schottky diode, a diode having a PN junction, a diode having a PIN junction, or a transistor in which a gate electrode is connected to a drain electrode is given. Needless to say, a diode having another structure can also be used. Here, a case is shown in which a PN junction diode 211 including semiconductor layers 244 and 245 is provided between the first electrode layer 104 and the layer 205 containing an organic compound. One of the semiconductor layers 244 and 245 is an N-type semiconductor while the other is a P-type semiconductor. By providing the element having a rectifying action in this way, the selectivity of a memory cell can be improved and operation margin of reading and writing can be improved.

When the layer 105 containing an organic compound is formed by a layer having a function of emitting light, the element 151 which has the layer containing an organic compound functions as the light-emitting element. In this case, the layer 105 containing an organic compound is formed with an organic compound having a light-emitting property.

As the organic compound having a light-emitting property, for example, the following are given: 9,10-di(2-naphthyl)anthracene (abbreviation: DNA); 2-tert-butyl-9,10-di(2-naphthyl)anthracene (abbreviation: t-BuDNA); 4,4'-bis(2,2-diphenylvinyl)biphenyl (abbreviation: DPVBi); coumarin 30; coumarin 6; coumarin 545; coumarin 545T; perylene; rubrene; periflanthene; 2,5,8,11-tetra(tert-butyl)perylene (abbreviation: TBP); 9,10-diphenylanthracene (abbreviation: DPA); 5,12-diphenyltetracene; 4-(dicyanomethylene)-2-methyl-6-[p-(dimethylamino)styryl]-4H-pyran (abbreviation: DCM1); 4-(dicyanomethylene)-2-methyl-6-[2-(joulolidin-9-yl)ethenyl]-4H-pyran (abbreviation: DCM2); 4-(dicyanomethylene)-2,6-bis[p-(dimethylamino)styryl]-4H-pyran (abbreviation: BisDCM); and the like. Moreover, compounds capable of emitting phosphorescence such as the following can be given: bis[2-(4',6'-difluorophenyl)pyridinato-N,$C^2$](picolinato)iridium (abbreviation: FIrpic); bis{2-[3',5'-bis(trifluoromethyl)phenyl]pydinato-N,$C^2$}(picolinate)iridium (abbreviation: Ir($CF_3$ppy)$_2$(pic)); tris(2-phenylpyridinato-N,$C^2$)iridium (abbreviation: Ir(ppy)$_3$); (acetylacetonato)bis(2-phenylpyridinato-N,$C^2$)iridium (abbreviation: Ir(ppy)$_2$(acac)); (acetylacetonato)bis[2-(2'-thienyl)pyridinato-N,$C^3$]iridium (abbreviation: Ir(thp)$_2$(acac)); (acetylacetonato)bis(2-phenylquinolinato-N,$C^2$)iridium (abbreviation: Ir(pq)$_2$(acac)); (acetylacetonato)bis[2-(2'-benzothienyl)pyridinato-N,$C^3$]iridium (abbreviation: Ir(btp)$_2$(acac)), and the like.

Figure 7A:
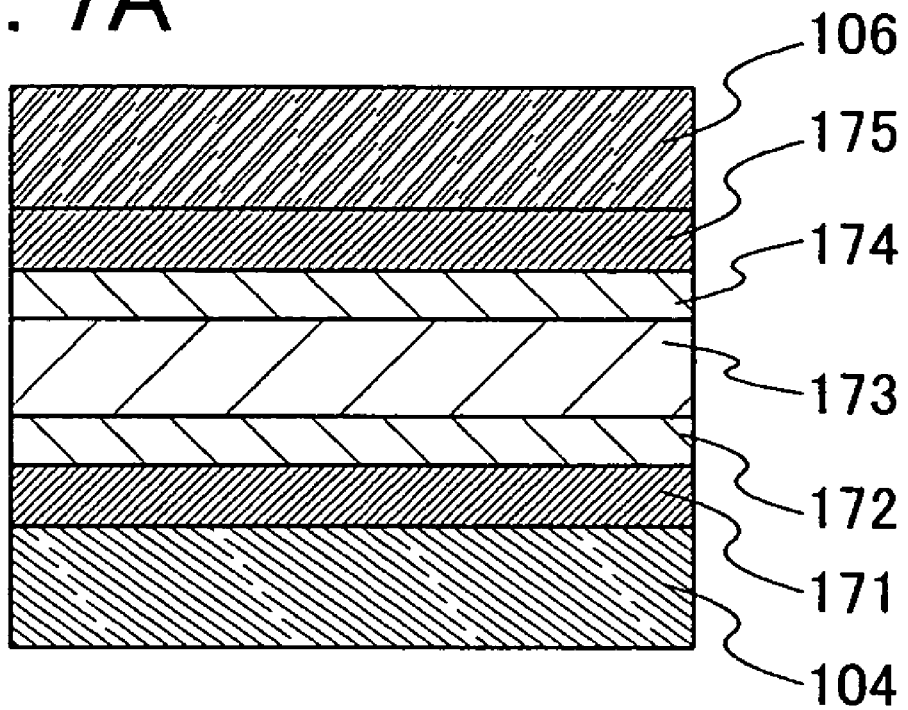
FIGS. 7A and 7B are cross-sectional views describing structures of light-emitting elements which can be applied to the present invention.
Figure 7B:
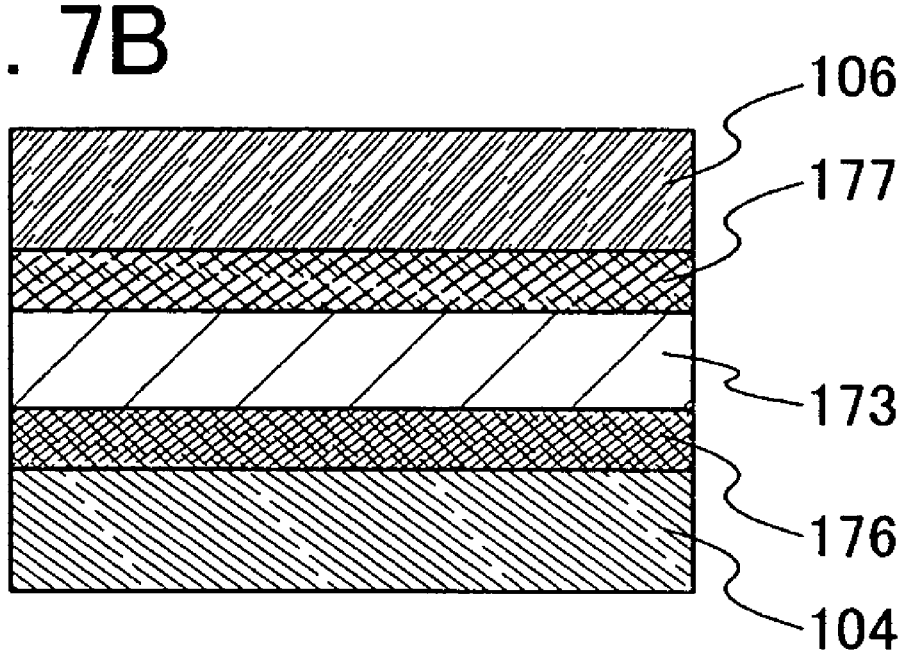

It is to be noted that a multilayer of 171 to 175 in FIG. 7A corresponds to 105, and a multilayer of 173, 176, and 177 in FIG. 7B corresponds to 105. As shown in FIG. 7A, the element 151 functioning as a light-emitting element may be formed by stacking a hole-injecting layer 171 formed with a hole-injecting material, a hole-transporting layer 172 formed with a hole-transporting material, a light-emitting layer 173 formed with an organic compound having a light-emitting property, an electron-transporting layer 174 formed with an electron-transporting material, and an electron-injecting layer 175 formed with an electron-injecting material, and the second electrode layer 106 which are provided over the first electrode layer 104.

Here, the hole-transporting material cited in the description of the layer 205 containing an organic compound in FIG. 6A can be used appropriately as the hole-transporting material.

A phthalocyanine derivative is effective as the hole-injecting material, and phthalocyanine (abbreviation: H$_2$Pc), copper phthalocyanine (abbreviation: CuPc), vanadyl phthalocyanine (abbreviation: VOPc), and the like can be used. Moreover, a conductive high-molecular compound which has been chemically doped, polyethylene dioxythiophene (abbreviation: PEDOT) doped with polystyrenesulfonate (abbreviation: PSS), polyaniline (abbreviation: PAni), or the like can be used. Moreover, a thin film of an inorganic semiconductor such as molybdenum oxide (MoO$_x$), vanadium oxide (VO$_x$), or nickel oxide (NiO$_x$), or an ultrathin film of an inorganic insulator such as aluminum oxide (Al$_2$O$_3$) is also effective. Further, the following aromatic amine compounds are also applicable: 4,4',4"-tris(N,N-diphenyl-amino)-triphenylamine (abbreviation: TDATA); 4,4',4"-tris[N-(3-methylphenyl)-N-phenyl-amino]triphenylamine (abbreviation: MTDATA); N,N'-bis(3-methylphenyl)-N,N'-diphenyl-1,1'-biphenyl-4,4'-diamine (abbreviation: TPD); 4,4'-bis{N-[4-(N,N-di-m-tolylamino)phenyl]-N-phenylamino}biphenyl (abbreviation: DNTPD); and the like. Moreover, these aromatic amine compounds may be doped with a substance having an acceptor property with respect to the aromatic amine compounds; specifically, VOPc doped with 2,3,5,6-tetrafluoro-7,7,8,8-tetracyanoquinodimethane (abbreviation: F$_4$-TCNQ) or NPB doped with MoO$_x$, which is an acceptor, may be used.

As the electron-transporting material, the electron-transporting material cited in the description of the layer 205 containing an organic compound shown in FIG. 6A can be appropriately used here.

As the electron-injecting material, in addition to the aforementioned electron-transporting materials, an ultrathin film of an insulator is often used; for example, a halide of an alkali metal such as LiF or CsF, a halide of an alkaline earth metal such as CaF$_2$, or an oxide of an alkali metal such as Li$_2$O. Moreover, an alkali metal complex such as lithium acetylacetonate (abbreviation: Li(acac)) or 8-quinolinolato-lithium (abbreviation: Liq) is also effective. Further, a material in which the aforementioned electron-transporting material and a metal having a low work function such as Mg, Li, or Cs are mixed by a co-evaporation method or the like can be used.

As shown in FIG. 7B, the element 151 functioning as a light-emitting element may be formed by stacking the first electrode layer 104, a hole-transporting layer 176 formed with an organic compound and an inorganic compound having an electron-accepting property with respect to the organic compound, a light-emitting layer 173, an electron-transporting layer 177 formed with an organic compound and an inorganic compound having an electron-donating property with respect to the organic compound, and the second electrode layer 106.

The hole-transporting layer 176 formed with an organic compound and an inorganic compound having an electron-accepting property with respect to the organic compound is formed by appropriately using the aforementioned organic compound having a hole-transporting property as the organic compound. As the inorganic compound, any inorganic compound can be used as long as electrons are easily accepted from the organic compound, and various metal oxides or metal nitrides can be used. In particular, an oxide of a transition metal belonging to any of Groups 4 to 12 of the periodic table of the elements is preferable because such an oxide is likely to have an electron-accepting property. Specifically, titanium oxide, zirconium oxide, vanadium oxide, molybdenum oxide, tungsten oxide, rhenium oxide, ruthenium oxide, zinc oxide, or the like is given. Among the metal oxides described above, an oxide of a transition metal belonging to any of Groups 4 to 8 of the periodic table of the elements is preferable for its high electron-accepting property. In particular, vanadium oxide, molybdenum oxide, tungsten oxide, and rhenium oxide are preferable because they can be evaporated in vacuum and are easily treated.

The electron-transporting layer 177 formed with an organic compound and an inorganic compound having an electron-donating property with respect to the organic compound is formed by appropriately using the aforementioned organic compound having an electron-transporting property as the organic compound. As the inorganic compound, any inorganic compound can be used as long as electrons are easily donated to the organic compound, and various metal oxides or metal nitrides can be used. In particular, an alkali metal oxide, an alkaline earth metal oxide, a rare earth metal oxide, an alkali metal nitride, an alkaline earth metal nitride, and a rare earth metal nitride are preferable because such oxides and nitrides are likely to have an electron-donating property. Specifically, lithium oxide, strontium oxide, barium oxide, erbium oxide, lithium nitride, magnesium nitride, calcium nitride, yttrium nitride, lanthanum nitride, or the like is given. In particular, lithium oxide, barium oxide, lithium nitride, magnesium nitride, and calcium nitride are preferable because they can be evaporated in vacuum and are easily treated.

Since the electron-transporting layer or the hole-transporting layer formed with the organic compound and the inorganic compound is superior in an electron-injecting/transporting property, various materials can be used to form the first electrode layer 104 and the second electrode layer 106 without much restriction by the work function, and moreover, the drive voltage may be decreased.

When the layer 105 containing an organic compound is formed by a layer generating photocurrent, the element 151 which has the layer containing an organic compound functions as a photoelectric conversion element or a solar cell. In this case, the layer 105 containing an organic compound is formed to be a stack of charge-generating layer and a charge-accepting layer, which has a PN junction.

Figure 8A:
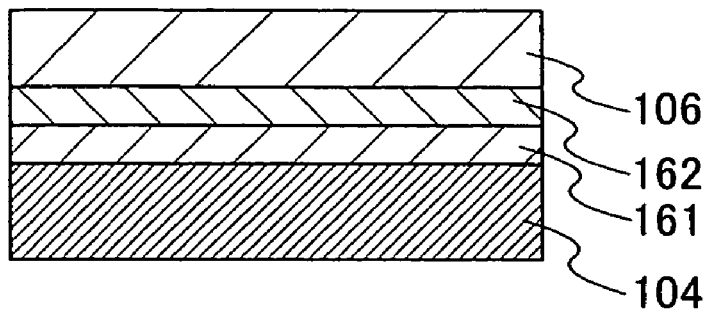
FIGS. 8A to 8D are cross-sectional views describing structures of photoelectric conversion elements which can be applied to the present invention.
Figure 8B:
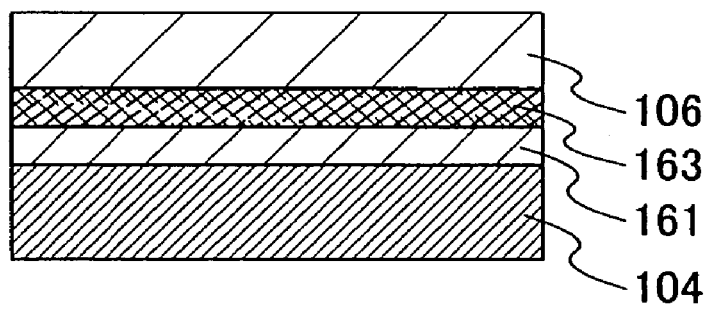
Figure 8C:
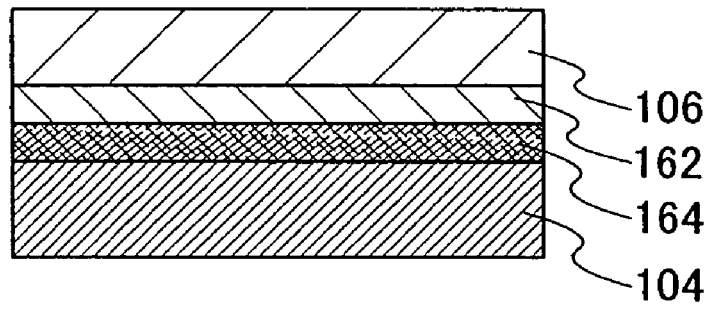
Figure 8D:
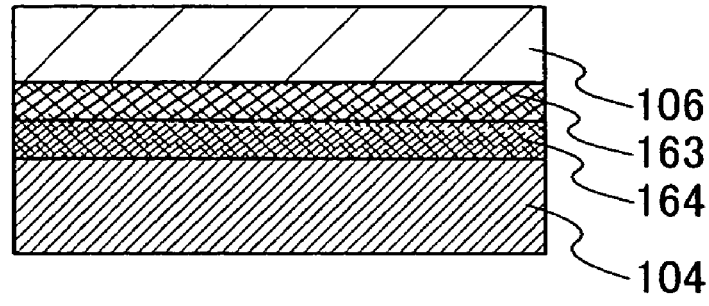

It is to be noted that a multilayer of 161 and 162 in FIG. 8A corresponds to 105, a multilayer of 161 and 163 in FIG. 8B corresponds to 105, a multilayer of 162 and 164 in FIG. 8C corresponds to 105, and a multilayer of 163 and 164 in FIG. 8D corresponds to 105. As shown in FIG. 8A, a photoelectric conversion element and a solar cell each have a multilayer structure in which the first electrode layer 104, the charge-generating layer 161, a charge-accepting layer 162, and the second electrode layer 106 are provided sequentially.

The first electrode layer 104 or the second electrode layer 106 is formed with a conductive material having a light-transmitting property. The charge-generating layer 161 and the charge-accepting layer 162 may be formed by appropriately selecting the aforementioned organic compound having a hole-transporting property and organic compound having an electron-transporting property. Moreover, as the organic compound having an electron-transporting property, a perylene derivative, a naphthalene derivative, a quinone derivative, methylviologen, fullerene, an organic metal compound containing ruthenium, platinum, titanium, or the like, or the like may be used. Here, the charge-generating layer 161 is formed with a compound having a hole-transporting property, and the charge-accepting layer 162 is formed with a compound having an electron-transporting property.

As shown in FIG. 8B, an electron-transporting layer 163 formed with an organic compound having an electron-transporting property and an inorganic compound having an electron-donating property with respect to the organic compound may be provided instead of the charge-accepting layer 162. The electron-transporting layer 163 can be formed by appropriately selecting a compound shown as the electron-transporting layer 177 in FIG. 7B, which is formed with the organic compound having an electron-transporting property and the inorganic compound having an electron-donating property with respect to the organic compound.

As shown in FIG. 8C, an electron-generating layer 164 formed with an organic compound having a hole-transporting property and an inorganic compound having an electron-accepting property with respect to the organic compound may be provided instead of the charge-generating layer 161. The electron-generating layer 164 can be formed by appropriately selecting a compound shown as the hole-transporting layer 176 in FIG. 7B, which is formed with the organic compound having an electron-transporting property and the inorganic compound having an electron-accepting property with respect to the organic compound.

As shown in FIG. 8D, the electron-generating layer 164 formed with an organic compound having a hole-transporting property and an inorganic compound having an electron-accepting property with respect to the organic compound, and the electron-transporting layer 163 formed with an organic compound having an electron-transporting property and an inorganic compound having an electron-donating property with respect to the organic compound, are provided instead of the charge-generating layer 161 and the charge-accepting layer 162, respectively.

When the layer containing an organic compound is formed to be a layer having the PN junction between charge-generating layer and charge-accepting layer, electrons and holes generated in the charge-generating layer can be made electron carriers and hole carriers to become photocurrent. Accordingly, a solar cell and a photoelectric conversion device capable of converting light energy into electrical energy can be manufactured.

When the charge-generating layer or the charge-accepting layer is formed with an organic compound and an inorganic compound, electron and hole generating efficiency can be improved. Accordingly, a photoelectric conversion element and a solar cell having high energy conversion efficiency can be achieved.

Moreover, a thin film transistor formed by using a layer containing an organic compound in an active region (shown as an organic semiconductor transistor) may be formed as the element 151 which has a layer containing an organic compound.

Figure 9A:
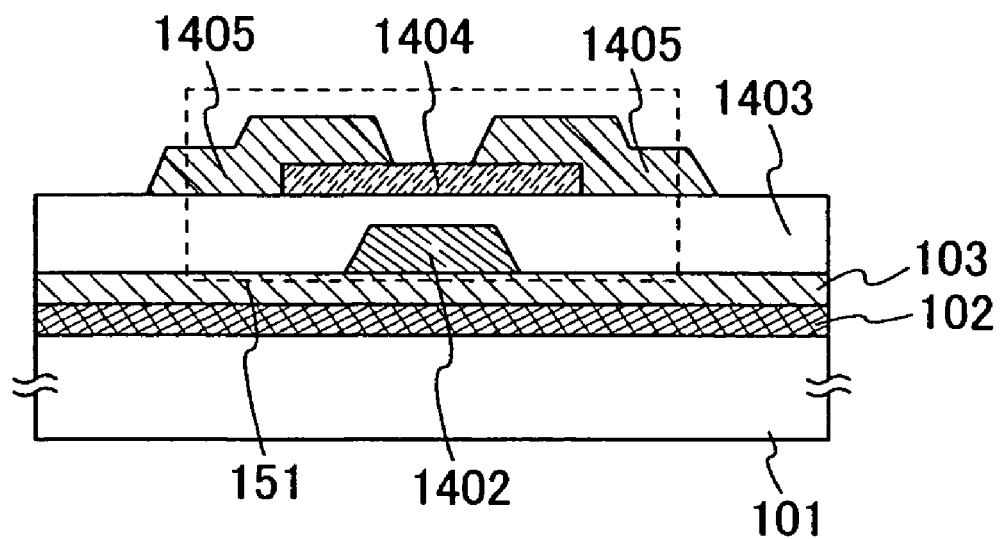
FIGS. 9A and 9B are cross-sectional views describing structures of organic thin film transistors which can be applied to the present invention.

Here, a structure of the organic semiconductor transistor is described with reference to FIGS. 9A and 9B. FIG. 9A shows an example of applying a staggered organic semiconductor transistor The separation layer 102 and the inorganic insulating layer 103 are provided over the substrate 101, and an organic semiconductor transistor is provided over the inorganic insulating layer 103 as the element 151 which has a layer containing an organic compound. In the organic semiconductor transistor, a gate electrode 1402, an insulating layer 1403 functioning as a gate insulating film, a semiconductor layer 1404 overlapping with the gate electrode and the insulating layer 1403 functioning as a gate insulating film, and a wire 1405 connected to the semiconductor layer 1404. The semiconductor layer 1404 is in contact with the wire 1405 and the insulating layer 1403 functioning as a gate insulating film.

The gate electrode 1402 can be formed by similar material and method to those of the first electrode layer 104. The gate electrode 1402 can also be formed by a droplet discharging method and by drying and/or baking. Moreover, the gate electrode 1402 can be formed over the inorganic insulating layer 103 by printing a paste containing fine particles by a printing method and drying and/or baking the paste. As typical examples of the fine particles, fine particles containing any of the following as its main component are given: gold; copper; an alloy of gold and silver; an alloy of gold and copper; an alloy of silver and copper; and an alloy of gold, silver, and copper. Moreover, a fine particle containing a conductive oxide such as indium tin oxide (ITO) as its main component may be used.

The insulating layer 1403 functioning as a gate insulating film can be formed by similar material and method to those of the inorganic insulating layer 103. Moreover, the insulating layer 1403 can be formed with an organic compound.

As the material for the semiconductor layer 1404 of the organic semiconductor transistor, a polycyclic aromatic compound, a conjugated-double-bond-based compound, phthalocyanine, a charge transfer complex, and the like are given. For example, anthracene, tetracene, pentacene, 6T (hexathiophene), TCNQ (tetracyanoquinodimethane), PTCDA (perylene tetracarboxylic dianhydride), NTCDA (naphthalene tetracarboxylic dianhydride), or the like can be used. Further, as the material for the semiconductor layer 1404 of the organic semiconductor transistor, a π-conjugated high molecular compound such as an organic high-molecular compound, carbon nanotube, polyvinyl pyridine, a phthalocyanine metal complex, and the like are given. In particular, a π-conjugated high molecular compound of which skeleton includes a conjugated double bond, such as polyacetylene, polyaniline, polypyrrole, polythienylene, a polythiophene derivative, poly(3alkylthiophene), a polyparaphenylene derivative, or a polyparaphenylenevinylene derivative is preferable.

As a method for forming the semiconductor layer 1404 of the organic semiconductor transistor, a method by which a film with uniform thickness can be formed may be used. The thickness ranges from 1 to 1000 nm, preferably from 10 to 100 nm. As a specific method, an evaporation method, an electron beam evaporation method, or the like can be used.

Figure 9B:
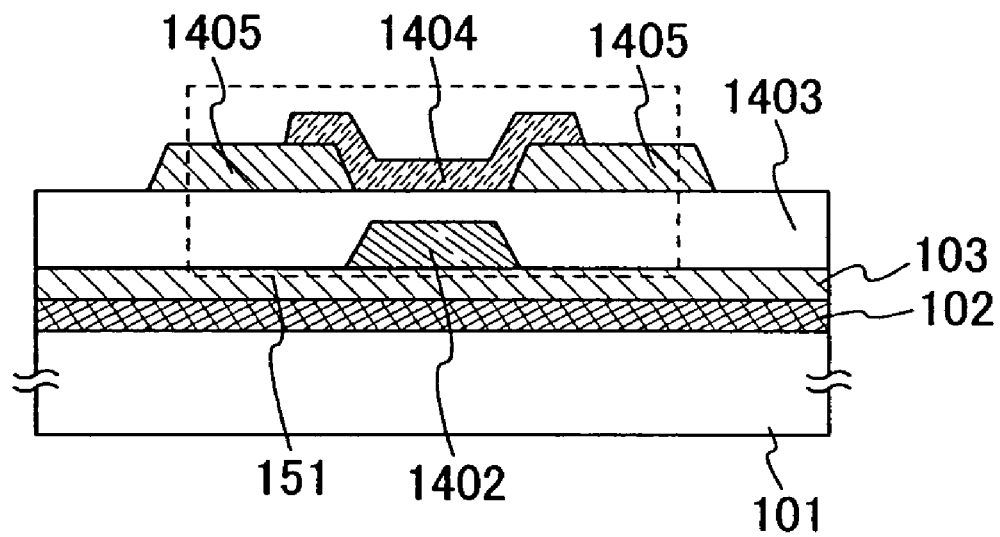

As shown in FIG. 9B, the gate electrode 1402, the insulating layer 1403 functioning as a gate insulating film, the wire 1405, and the semiconductor layer 1404 overlapping with the gate electrode and the insulating layer functioning as a gate insulating film may be formed. It is to be noted that the wire 1405 is in contact with the insulating layer functioning as a gate insulating film and the semiconductor layer 1404.

Figure 1C:
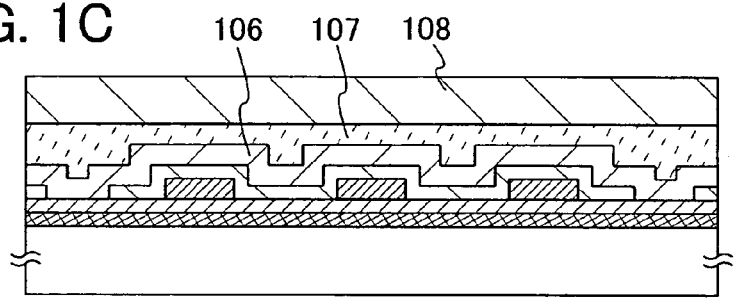

Next, as shown in FIG. 1C, the insulating layer 107 is formed over the second electrode layer 106. Next, a substrate 108 is attached on the surface of the insulating layer 107.

The insulating layer 107 is preferably formed by applying a composition by a coating method and then drying and/or heating the composition. Since the insulating layer 107 is provided as a protecting layer working in a later separation step, the insulating layer 107 preferably has little depression and projection on the surface. Such an insulating layer can be formed by a coating method. Moreover, the insulating layer 107 may be formed by forming a film by a thin-film forming method such as a CVD method or a sputtering method and then polishing the surface of the film by a CMP method. The insulating layer 107 formed by a coating method is formed by using an organic compound such as an acrylic resin, a polyimide resin, a melamine resin, a polyester resin, a polycarbonate resin, a phenol resin, an epoxy resin, polyacetal, polyether, polyurethane, polyamide (nylon), a furan resin, or a diallylphthalate resin; an inorganic siloxane polymer including a Si—O—Si bond (siloxane bond) among compounds including hydrogen, oxygen, and silicon formed by using a siloxane polymer-based material typified by silica glass as a starting material; or an organic siloxane polymer in which hydrogen bonded to silicon is substituted by an organic group such as methyl or phenyl, typified by an alkylsiloxane polymer, an alkylsilsesquioxane polymer, a silsesquioxane hydride polymer, an alkylsilsesquioxane hydride polymer; and the like. The insulating layer formed by the aforementioned thin-film forming method, which is then subjected to surface polishing by a CMP method, is formed with silicon oxide, silicon oxynitride, silicon nitride oxide, silicon nitride, or the like.

The substrate 108 is preferably a flexible, thin, and lightweight substrate. Typically, a substrate including PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, polyphthalamide, or the like can be used. Moreover, paper made of a fibrous material, a multilayer film including a base material film (polyester, polyamide, an inorganic evaporated film, paper, or the like) and an adhesive organic resin film (an acrylic-based organic resin, an epoxy-based organic resin, or the like), or the like can also be used. In the case of using the aforementioned substrate, although not shown, the insulating layer 107 and the substrate 108 are attached to each other by providing an adhesive layer between the insulating layer 107 and the substrate 108.

Alternatively, a film having an adhesive layer to which a laminate process is carried out to an object to be processed by thermocompression (such as a laminating film (including polypropylene, polyester, vinyl, polyvinyl fluoride, vinyl chloride, or the like)) may be used as the substrate 108. The laminating film can be attached to an object to be processed in such a way that an adhesive layer provided on a surface of a base film or a layer provided at an outermost layer of a base film (not the adhesive layer) is melted by a heat treatment and then, by applying pressure thereto, the film is attached to the object to be processed. In this case, the adhesive layer is not necessarily provided between the insulating layer 107 and the substrate 108.

Here, the insulating layer 107 is formed using an epoxy resin in such a way that a composition is applied by a coating method and then the composition is dried and/or baked. Next, the substrate 108 is attached over the insulating layer 107 by thermocompressing the laminating film on the surface of the insulating layer 107.

Figure 1D:
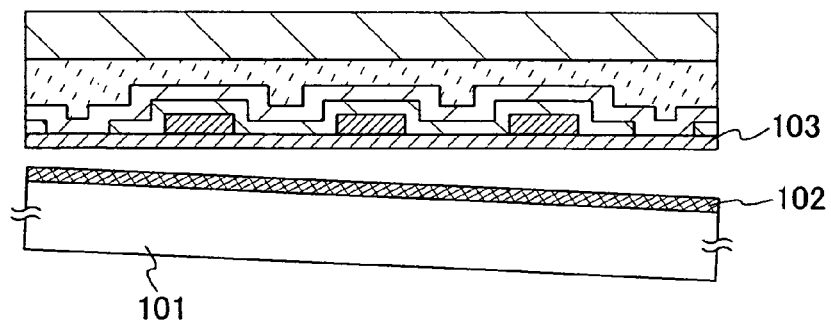

Next, as shown in FIG. 1D, the separation layer 102 and the inorganic insulating layer 103 are separated from each other. Here, the inorganic insulating layer 103 and the second electrode layer 106 are in contact with each other. Since the adhesiveness between the inorganic insulating layer 103 and the second electrode layer 106 is so high that separation is difficult to occur at an interface between the layer 105 containing an organic compound and the second electrode layer 106, and in consequence, it is achieved that separation is carried out at the peeling layer 102 and the inorganic insulating layer 103 in a separation step.

Although this embodiment mode uses a method for physically separating the element-formed layer, in which the separation layer and the insulating layer are formed between the substrate and the element-formed layer, the metal oxide film is provided between the separation layer and the insulating layer, and the metal oxide film is weakened by crystallization, the present invention is not restricted to this method. Any of the following methods can also be used appropriately: (1) a method in which an amorphous silicon film containing hydrogen is provided between the substrate and the element-formed layer, and the amorphous silicon film is irradiated with laser light so that hydrogen gas in the amorphous silicon film is released, thereby separating the substrate; (2) a method in which the separation layer and the insulating layer are formed between the substrate and the element-formed layer, the metal oxide film is provided between the separation layer and the insulating layer, the metal oxide film is weakened by crystallization, a part of the separation layer is etched away using a solution or a halogen fluoride gas such as $NF_3$, $BrF_3$, or $ClF_3$, and separation is physically carried out at the weakened metal oxide film; (3) a method in which only the substrate of the substrate where the element-formed layer is formed is mechanically removed or is etched away using a solution or a halogen fluoride gas such as $NF_3$, $Br_3$, or $ClF_3$; (4) a method in which a metal layer and a metal oxide layer are provided as the separation layer between the substrate having high heat resistance and a layer having a transistor, the metal oxide layer is weakened by crystallization, a part of the metal layer is etched away using a solution or a halogen fluoride gas such as $NF_3$, $BrF_3$, or $ClF_3$, and separation is physically carried out at the weakened metal layer; and the like.

Figure 1E:
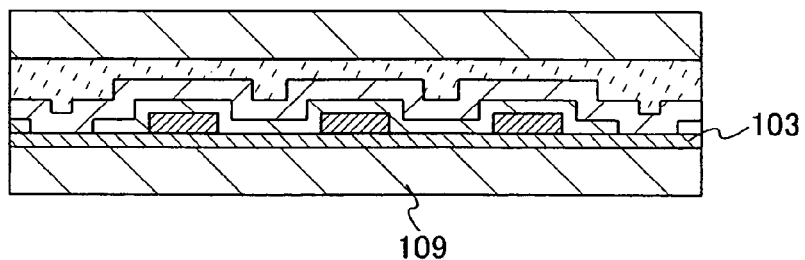

Next, as shown in FIG. 1E, a substrate 109 is attached on the surface of the inorganic insulating layer 103. The substrate 109 can be made of a similar material to that of the substrate 108. Here, the substrate 109 is attached on the inorganic insulating layer 103 by thermocompression of a laminating film.

By the above steps, the element which has the layer containing an organic compound can be provided over the flexible substrate with high yield using the separation step.

Embodiment Mode 2

With reference to FIGS. 2A to 2E, this embodiment mode will describe a method for separating an element-formed layer, which is different from that in Embodiment Mode 1. This embodiment mode is different from Embodiment Mode 1 in that an insulating layer (partition wall) is provided so as to cover an edge portion of the first electrode layer.

As shown in FIG. 2A, the separation layer 102 is formed over the substrate 101, similarly to Embodiment Mode 1. The inorganic insulating layer 103 is formed over the separation layer 102 and the first electrode layer 104 is formed over the inorganic insulating layer 103.

Next, an insulating layer (partition wall) 111 is formed covering an edge portion of the first electrode layer 104. In this embodiment mode, the insulating layer 111 is formed by using an inorganic insulator such as silicon oxide, silicon nitride, silicon oxynitride, or aluminum nitride by a thin-film forming method such as a CVD method or a sputtering method. Here, the insulating layer 111 is formed in such a way that an insulating film is formed by a thin-film forming method and then the insulating film is selectively etched so that the first electrode layer 104 is partially exposed.

The insulating layer 111 is preferably etched so that its cross sectional shape has a tilt angle of 30 to 75°, preferably 35 to 60°. By having such a tilt angle, the coverage for the edge portion of the cross section of the later-formed layer containing an organic compound is improved, whereby breaking due to steps can be prevented as well as yield can be improved.

Next, a layer 112 containing an organic compound is formed on the exposed surface of the insulating layer 111 and the first electrode layer 104, similarly to Embodiment Mode 1. The layer 112 containing an organic compound is formed so that the insulating layer 111 is partially exposed. In other words, an exposed portion 114 of the insulating layer 111 is formed.

Next, as shown in FIG. 2B, a second electrode layer 113 is formed over the layer 112 containing an organic compound and the exposed portion 114 of the insulating layer 111, similarly to Embodiment Mode 1. Accordingly, a region 115 can be formed in which the insulating layer 111 is in contact with the second electrode layer 113. In the region 115 where the insulating layer 111 is in contact with the second electrode layer 113, the adhesion between the insulating layer 111 and the second electrode layer 113 is so high that separation is difficult to occur at an interface between the layer 112 containing an organic compound and the second electrode layer 113, and in consequence, it is achieved that separation is carried out at the separation layer 102 and the inorganic insulating layer 103.

Here, a stack of the inorganic insulating layer 103 through the second electrode layer 113 is called an element-formed layer 153.

Since the formation of the insulating layer 107 and the attaching of the substrate 108 which are shown in FIG. 2C, the separation step shown in FIG. 2D, and the attaching of the substrate 109 shown in FIG. 2E are similar to those in Embodiment Mode 1, the description thereof is omitted here.

In accordance with the above steps, the element which has the layer containing an organic compound can be provided over the flexible substrate with high yield by using the separation step.

Embodiment Mode 3

With reference to FIGS. 3A to 3E, this embodiment mode will describe a method for separating an element-formed layer, which is different from that in Embodiment Mode 1. This embodiment mode is different from Embodiment Mode 2 in that the insulating layer (partition wall) covering the edge portions of the first electrode layer is formed with an organic compound.

Figure 3A:
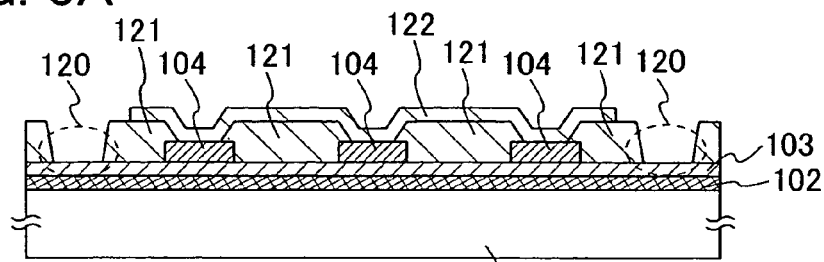
FIGS. 3A to 3E are cross-sectional views describing manufacturing steps of a semiconductor device of the present invention.

As shown in FIG. 3A, the separation layer 102 is formed over the substrate 101, the inorganic insulating layer 103 is formed over the separation layer 102, and the first electrode layer 104 is formed over the inorganic insulating layer 103, similarly to Embodiment Mode 1.

Next, an insulating layer (partition wall) 121 covering the edge portions of the first electrode layer 104 is formed. In this embodiment mode, the insulating layer 121 is formed by a coating method, a printing method, or a droplet discharging method, using a nonphotosensitive organic compound such as an acrylic resin, a polyimide resin, a melamine resin, a polyester resin, a polycarbonate resin, a phenol resin, an epoxy resin, polyacetal, polyether, polyurethane, polyamide (nylon), a furan resin, or a diallylphthalate resin. It is to be noted that the organic compound that forms the insulating layer 121 has a polar substituent such as an imide group, a cyano group, or a hydroxyl group. In the case of forming the insulating layer 121 by a coating method, the insulating layer 121 is formed in such a way that an insulating film is formed by discharging a composition and drying and baking the composition and the insulating film is selectively etched away by using a resist mask formed by a photolithography step so that the first electrode layer 104 and the inorganic insulating layer 103 are partially exposed. In the case of forming the insulating layer 121 by a printing method or a droplet discharging method, the insulating layer 121 is formed by applying a composition so as to cover the edge portions of the first electrode layer 104 and partially expose the inorganic insulating layer 103, and drying and baking the composition.

Here, the insulating layer 121 is formed in such a way that an insulating film is formed by a coating method and the insulating film is partially removed by dry etching so that the first electrode layer 104 and the inorganic insulating layer 103 are partially exposed. That is, the insulating layer 121 is formed so that an exposed portion 120 of the inorganic insulating layer 103 is formed.

The insulating layer 121 is preferably etched so that its cross sectional shape has a tilt angle of 30 to 75°, preferably 35 to 60°, similarly to the insulating layer 111 shown in Embodiment Mode 2.

Next, a layer 122 containing an organic compound is formed over the insulating layer 121 and the exposed surface of the first electrode layer 104, similarly to Embodiment Mode 1.

Figure 3B:
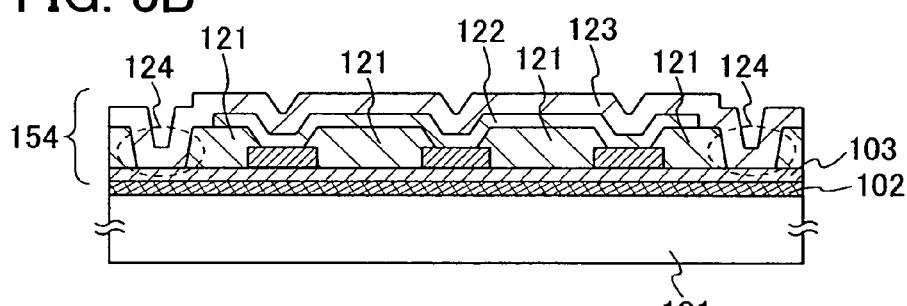

Subsequently, as shown in FIG. 3B, a second electrode layer 123 is formed over the layer 122 containing an organic compound, the insulating layer 121, and the exposed portion 120 of the inorganic insulating layer 103, similarly to Embodiment Mode 1. Accordingly, a region 124 can be formed where the inorganic insulating layer 103 is in contact with the second electrode layer 123. In the region 124 where the inorganic insulating layer 103 is in contact with the second electrode layer 123, the adhesion between the inorganic insulating layer 103 and the second electrode layer 123 is so high that separation is difficult to occur at an interface between the layer 122 containing an organic compound and the second electrode layer 123, and separation can be carried out at the separation layer 102 and the inorganic insulating layer 103.

Here, a stack of the inorganic insulating layer 103 through the second electrode layer 123 is called an element-formed layer 154.

Figure 3C:
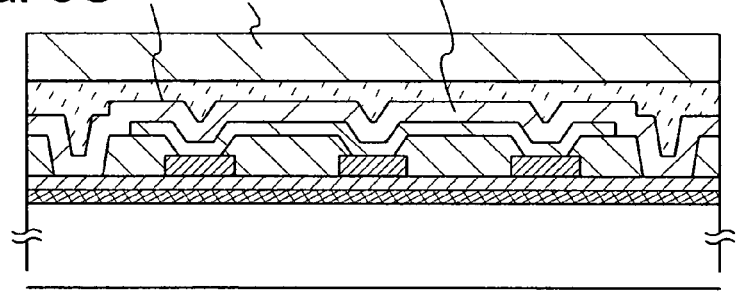
Figure 3D:
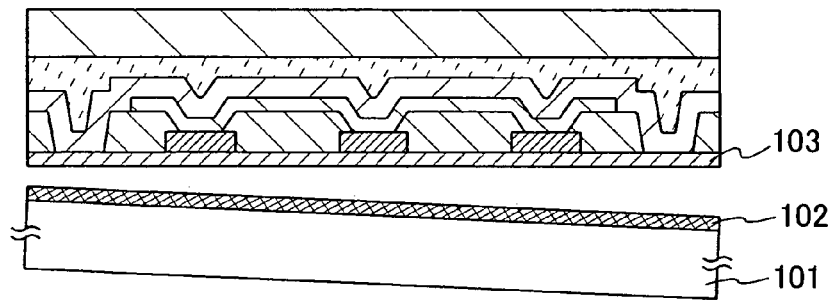
Figure 3E:
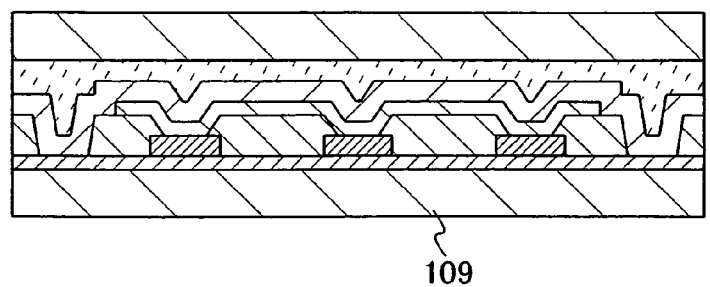

Since the formation of the insulating layer 107 and the attaching of the substrate 108 which are shown in FIG. 3C, the separation step shown in FIG. 3D, and the attaching of the substrate 109 shown in FIG. 3E are similar to those in Embodiment Mode 1, the description thereof is omitted here.

In accordance with the above steps, the element which has the layer containing an organic compound can be provided over the flexible substrate with high yield by using the separation step.

Embodiment Mode 4

With reference to FIGS. 4A to 4E, this embodiment mode will describe a method for separating an element-formed layer having a different structure from those of Embodiment Modes 1 to 3. This embodiment mode is different from Embodiment Mode 3 in that the insulating layer (partition wall) covering the edge portions of the first electrode layer is formed with a photosensitive organic compound.

Figure 4A:
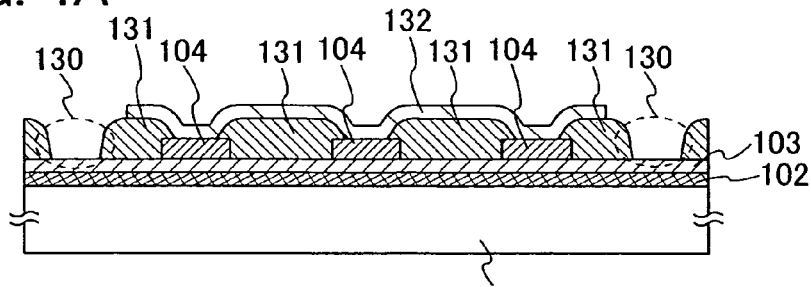
FIGS. 4A to 4E are cross-sectional views describing manufacturing steps of a semiconductor device of the present invention.

As shown in FIG. 4A, the separation layer 102 is formed over the substrate 101, the inorganic insulating layer 103 is formed over the separation layer 102, and the first electrode layer 104 is formed over the inorganic insulating layer 103, similarly to Embodiment Mode 1.

Next, an insulating layer (partition wall) 131 covering the edge portions of the first electrode layer 104 is formed. In this embodiment mode, the insulating layer 131 is formed with a positive or negative photosensitive material such as acrylic, polyimide, styrene, vinyl chloride, a diazo resin, an azide compound, a novolac resin, or polyvinyl cinnamate. It is to be noted that a sensitizer may be added to the photosensitive material. The insulating layer 131 is formed by a coating method, a printing method, or a droplet discharging method. In the case of forming the insulating layer 131 by a coating method, the insulating layer 131 is formed in such a way that an insulating film is formed by discharging a composition and drying and baking the composition, the insulating film is light-exposed, developed, and then partially removed so that the first electrode layer 104 and the inorganic insulating layer 103 are partially exposed, and the insulating film is baked. The insulating layer 131 formed by light-exposing and developing the photosensitive organic compound has curvature at an upper edge portion thereof. Therefore, it is possible to prevent breaking of the later-formed layer containing an organic compound and to improve yield.

Here, the insulating layer 131 is formed in such a way that an insulating film is formed by applying a composition containing photosensitive acrylic by a coating method and drying the composition, and then the insulating film is light-exposed and developed by a photolithography step, and baked, so that the first electrode layer 104 and the inorganic insulating layer 103 are partially exposed. That is, an exposed portion 130 of the inorganic insulating layer 103 is formed.

The insulating layer 131 is preferably etched so that its cross sectional shape has a tilt angle of 30 to 75°, preferably 35 to 60°, similarly to the insulating layer 111 shown in Embodiment Mode 2.

Next, a layer 132 containing an organic compound is formed over the insulating layer 131 and an exposed surface of the first electrode layer 104, similarly to Embodiment Mode 1.

Figure 4B:
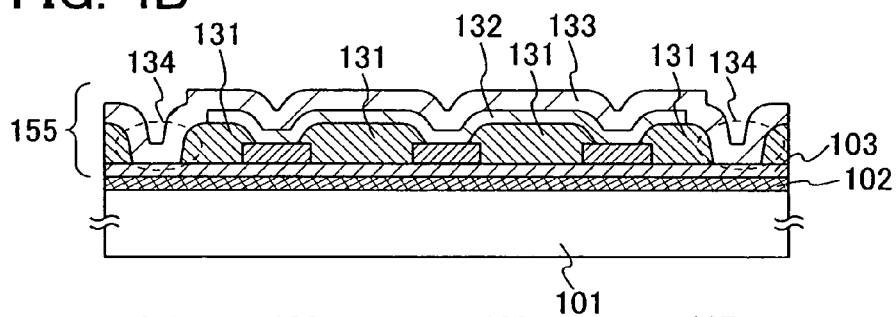

Subsequently, as shown in FIG. 4B, a second electrode layer 133 is formed over the layer 132 containing an organic compound, the insulating layer 131, and the exposed portion 130 of the inorganic insulating layer 103, similarly to Embodiment Mode 1. Accordingly, a region 134 can be formed where the inorganic insulating layer 103 is in contact with the second electrode layer 133. In the region 134 where the inorganic insulating layer 103 is in contact with the second electrode layer 133, the adhesion between the inorganic insulating layer 103 and the second electrode layer 133 is so high that separation is difficult to occur at an interface between the layer 132 containing an organic compound and the second electrode layer 133, and separation can be carried out at the separation layer 102 and the inorganic insulating layer 103.

It is to be noted that a stack of the inorganic insulating layer 103 through the second electrode layer 133 is called an element-formed layer 155.

Figure 4C:
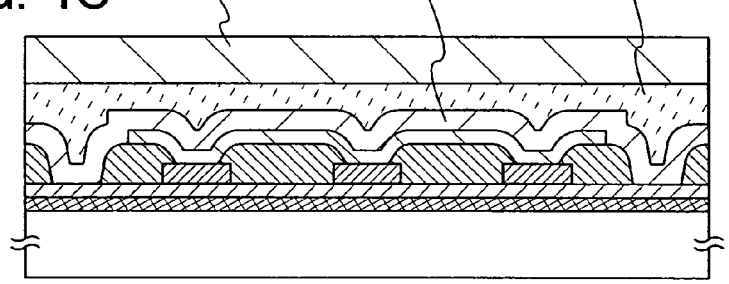
Figure 4D:
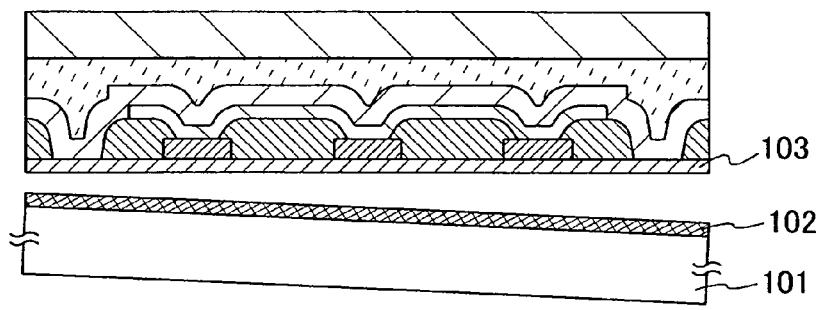
Figure 4E:
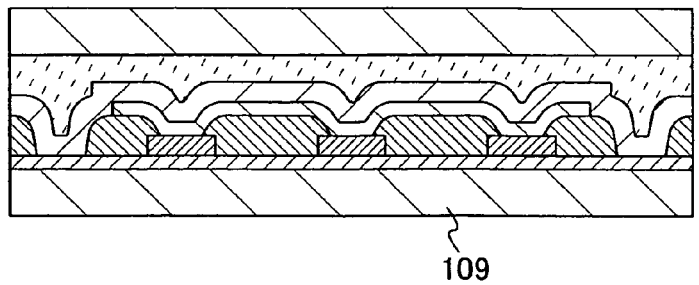

Since the formation of the insulating layer 107 and the attaching of the substrate 108 which are shown in FIG. 4C, the separation step shown in FIG. 4D, and the attaching of the substrate 109 shown in FIG. 4E are similar to those in Embodiment Mode 1, the description thereof is omitted here.

In accordance with the above steps, the element which has the layer containing an organic compound can be provided over the flexible substrate with high yield by using the separation step.

Embodiment Mode 5

This embodiment mode will describe a method for separating an element-formed layer having a different structure from that in Embodiment Modes 1 to 4, with reference to FIGS. 5A to 5E. This embodiment mode is different from Embodiment Modes 2 and 3 in that the second electrode layer is in contact with a conductive layer formed similarly to the first electrode layer.

Figure 5A:
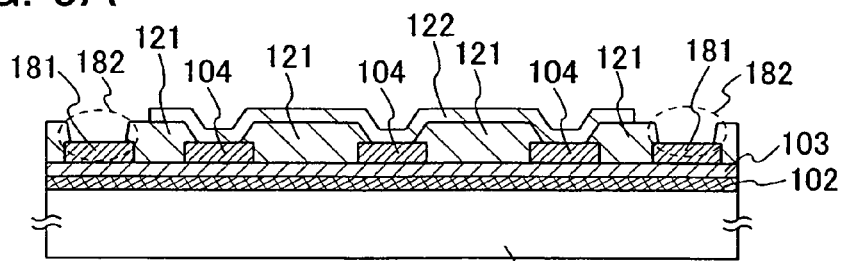
FIGS. 5A to 5E are cross-sectional views describing manufacturing steps of a semiconductor device of the present invention.

As shown in FIG. 5A, the separation layer 102 is formed over the substrate 101, the inorganic insulating layer 103 is formed over the separation layer 102, and the conductive layer is formed over the inorganic insulating layer 103, similarly to Embodiment Mode 1. After that, the conductive layer is selectively etched by using a resist mask formed by a photolithography step, thereby forming the first electrode layer 104 and a conductive layer 181.

Next, the insulating layer 121 covering the edge portions of the first electrode layer 104 is formed similarly to Embodiment Mode 2. Subsequently, the layer 122 containing an organic compound is formed over the insulating layer 121 and the exposed surface of the first electrode layer 104, similarly to Embodiment Mode 1. It is to be noted that the layer 122 containing an organic compound is formed so that the conductive layer 181 is partially exposed. An exposed portion of the conductive layer 181 is denoted by 182.

Figure 5B:
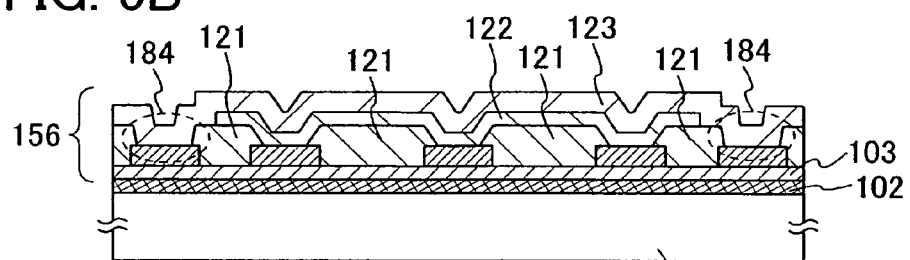

Next, as shown in FIG. 5B, the second electrode layer 123 is formed so as to be in contact with the layer 122 containing an organic compound and the exposed portion 182 of the first conductive layer 181, similarly to Embodiment Mode 1. Accordingly, a region 184 can be formed where the conductive layer 181 is in contact with the second electrode layer 123. In the region 184 where the conductive layer 181 is in contact with the second electrode layer 123, the adhesion between the conductive layer 181 and the second electrode layer 123 is so high that separation is difficult to occur at an interface between the layer 122 containing an organic compound and the second electrode layer 123 in a separation step, and separation can be carried out at the separation layer 102 and the inorganic insulating layer 103.

It is to be noted that a stack of the inorganic insulating layer 103 through the second electrode layer 123 is called an element-formed layer 156.

Figure 5C:
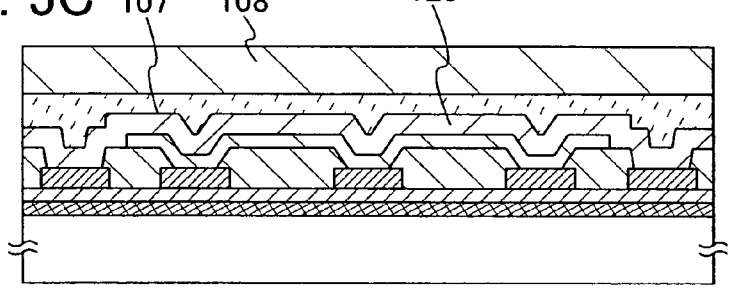
Figure 5D:
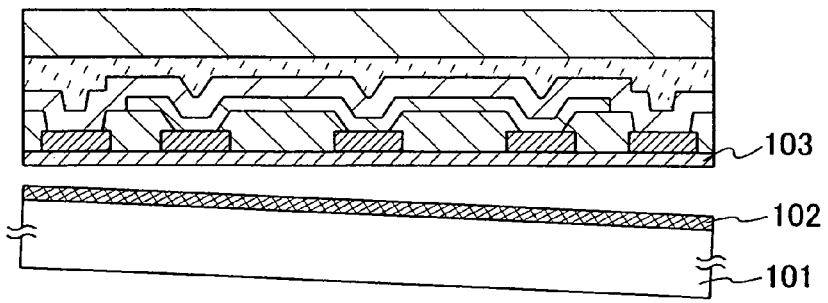
Figure 5E:
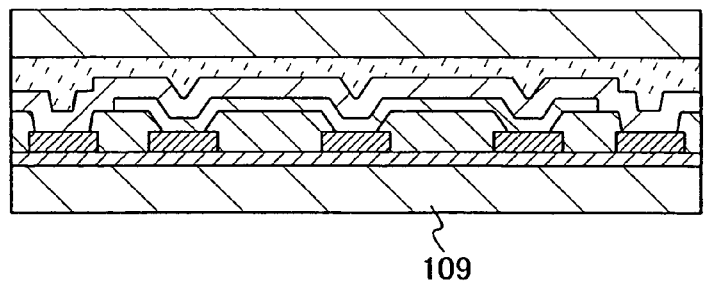

Since the formation of the insulating layer 107 and the attaching of the substrate 108 which are shown in FIG. 5C, the separation step shown in FIG. 5D, and the attaching of the substrate 109 shown in FIG. 5E are similar to those in Embodiment Mode 1, the description thereof is omitted here.

In accordance with the above steps, the element which has the layer containing an organic compound can be provided over the flexible substrate with high yield by using the separation step.

Embodiment 1

This embodiment will describe a semiconductor device having a storage element as an element which has a layer containing an organic compound, typically a storage device.

Figure 10A:
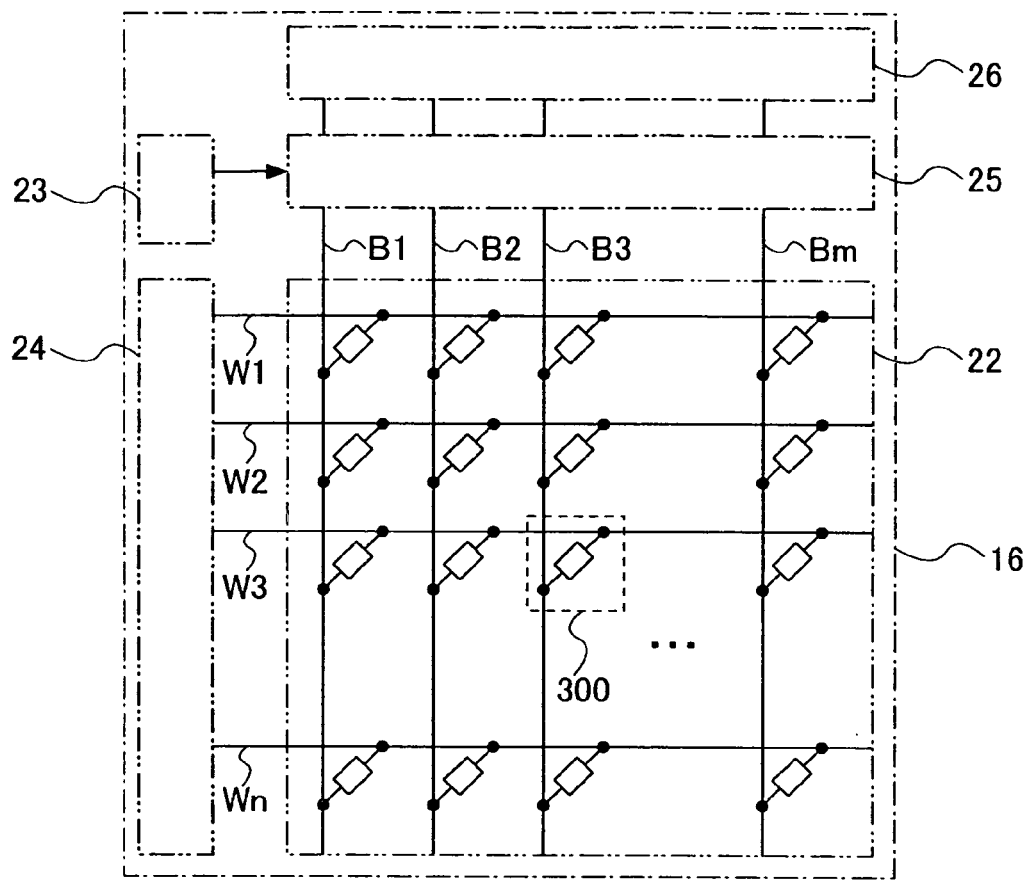
FIGS. 10A to 10C describe semiconductor devices of the present invention.

FIG. 10A shows a structural example of a semiconductor device which will be described in this embodiment. The semiconductor device includes a memory cell array 22 in which memory cells 300 are arranged in a matrix form, decoders 23 and 24, a selector 25, and a reading/writing circuit 26. It is to be noted that the structure of a storage circuit 16 shown here is just an example, and other circuits such as a sense amplifier, an output circuit, and a buffer may be provided, or a writing circuit may be provided in a bit line driver circuit.

The decoders 23 and 24, the selector 25, the reading/writing circuit 26, an interface, and the like can be formed over a substrate by using thin film transistors similarly to a storage element. Alternatively, they may be attached externally as IC chips.

The memory cell 300 has a first conductive layer connected to a bit line Bx ($1 \leq x \leq m$), a second conductive layer connected to a word line Wy ($1 \leq y \leq n$), and a layer containing an organic compound, which is in contact with the first conductive layer. The layer containing an organic compound is formed by one or more layers between the first conductive layer and the second conductive layer.

Figure 11A:
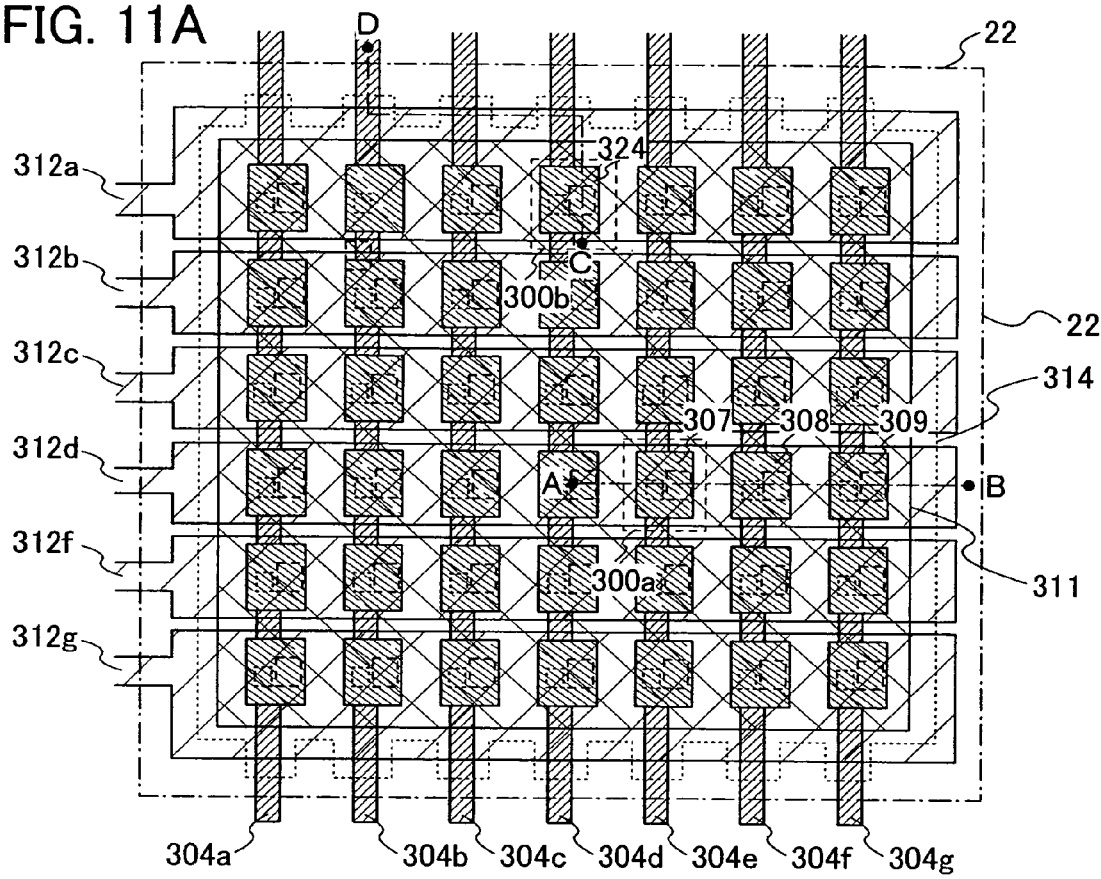
FIG. 11A is a top view and FIGS. 11B and 11C are cross-sectional views, which describe a semiconductor device of the present invention.
Figure 11B:
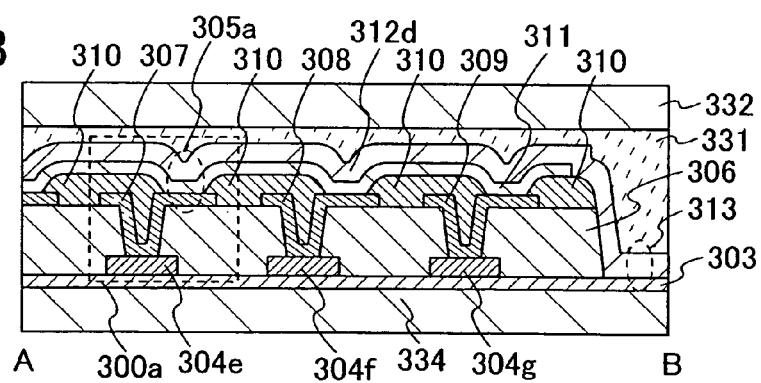
Figure 11C:
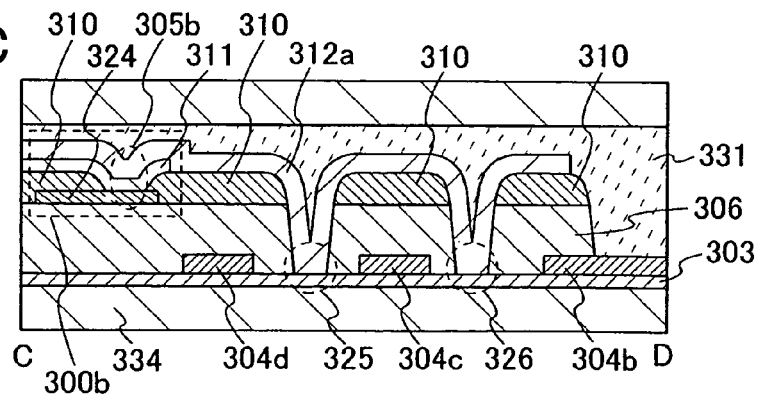

Examples of a top-surface structure and a cross-sectional structure of the memory cell array 22 are shown in FIGS. 11A to 11C. FIG. 11A shows a top-surface structure of the memory cell array 22, and its cross-sectional structures along a line A-B and a line C-D in FIG. 11A correspond to FIGS. 11B and 11C, respectively. In FIG. 11A, a region surrounded by a dotted line 314 is a region where a first organic insulating layer 306 and a second organic insulating layer 310 are formed. Substrates 332 and 334, and the organic insulating layers 306, 310, and 331 are omitted.

In the memory cell array 22, bit lines 304a to 304g and second electrode layers 312a to 312g are formed. Memory cells are formed at intersections of the bit lines and the word lines. In each memory cell, a storage element is formed by the first conductive layer, the layer containing an organic compound, and a second word line (a second electrode layer). A memory cell 300a formed at an intersection of the bit line 304e and the second electrode layer 312d and a memory cell 300b formed at an intersection of the bit line 304d and the second electrode layer 312a are described hereinafter (see FIG. 11A).

The memory cell 300a has a storage element 305a (see FIG. 11B). The storage element 305a has, over the substrate 334, a first electrode layer 307 connected to the bit line 304e extending in a first direction; a layer 311 containing an organic compound, which covers the first electrode layer 307; and a second electrode layer 312d extending in a second direction perpendicular to the first direction. In addition, in a peripheral portion of the memory cell array, a region 313 is formed where the insulating layer 303 is in contact with the second electrode layer 312d. Prior to data writing, the layer 311 containing an organic compound keeps a distance constant between the first electrode layer 307 and the second electrode layer 312d. Here, an insulating layer functioning as a protective film may be provided so as to cover the second electrode layer 312d.

As shown in FIG. 11C, the memory cell 300b has a storage element 305b. The storage element 305b has a first electrode layer 324 connected to a bit line extending in a first direction; the layer 311 containing an organic compound, which covers the first electrode layer 324; and the second electrode layer 312a extending in a second direction perpendicular to the first direction. Moreover, in a peripheral portion of the memory cell array, regions 325 and 326 are formed where the insulating layer 303 is in contact with the second electrode layer 312a.

Moreover, the insulating layer 331 is formed over the second electrode layers 312a to 312g to reduce depression and projection of the surface, and then the substrate 332 is attached over the insulating layer 331. A plastic film is used here as the substrate 332.

Although FIG. 11B shows an example in which the layer 311 containing an organic compound is formed so as to overlap with a plurality of the first electrode layers, the layer 311 containing an organic compound may be formed selectively only in each memory cell. In the latter case, the layer 311 containing an organic compound can be formed by an evaporation method using a metal mask. Further, usage efficiency of the material can be improved by providing the layer containing an organic compound in such a way that an organic compound is selectively discharged by a droplet discharging method or the like and the organic compound is baked.

The material and formation method of the bit lines 304a to 304g, the first electrode layers 307 and 324, and the second electrode layers 312a to 312g can be similar to those of the first electrode and the second electrode shown in Embodiment Mode 1.

The layer 311 containing an organic compound can be provided by similar material and forming method to those of the layer 105 containing an organic compound shown in Embodiment Mode 1.

Reduction in size, thickness, and weight of the semiconductor device can be achieved when the flexible substrate, the laminating film, the paper made of a fibrous material, or the like shown as the substrates 108 and 109 in Embodiment Mode 1 is used as the substrates 332 and 334.

Next, a method for manufacturing a passive matrix type semiconductor device is described with reference to FIGS. 12A to 12C.

Figure 12A:
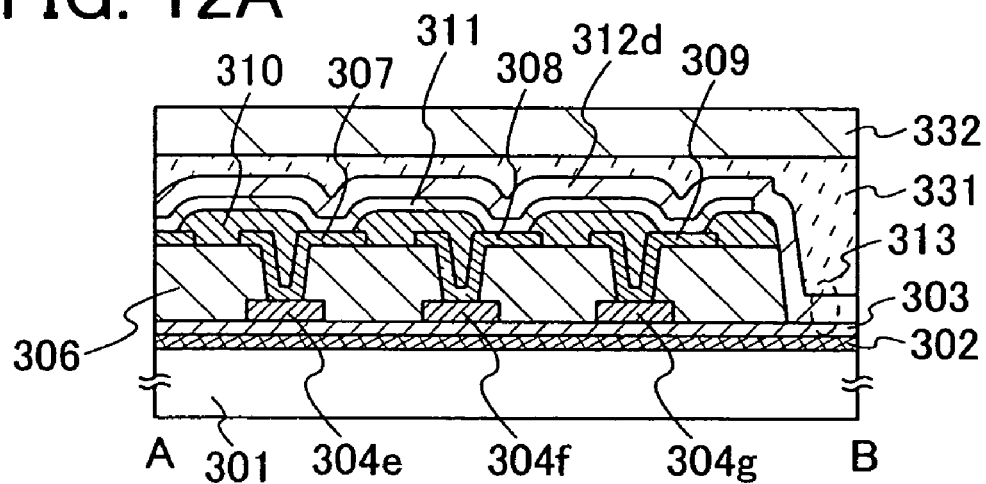
FIGS. 12A to 12C are cross-sectional views describing manufacturing steps of a semiconductor device of the present invention.

FIG. 12A is a cross-sectional view of a memory cell array of a passive matrix type semiconductor device. It is to be noted that peripheral circuits such as the bit line driver circuit, the word line driver circuit, and an interface are omitted.

As shown in FIG. 12A, a separation layer 302 is formed in 30 nm thick over a substrate 301, and the insulating layer 303 is formed over the separation layer 302. Here, a 30-nm-thick tungsten layer is formed as the separation layer 302 by a sputtering method, and a 100-nm-thick silicon oxide layer, a 50-nm-thick silicon nitride oxide layer, and a 100-nm-thick silicon oxynitride layer are formed as the insulating layer 303 by a CVD method. Subsequently, an amorphous silicon film is formed in 66 nm thick over the insulating layer 303 by a CVD method and subjected to heat treatments at 500° C. for one hour and at 550° C. for four hours, so that the amorphous silicon film is crystallized to form a crystalline silicon film. At the same time, a metal oxide, here a tungsten oxide layer, is formed at an interface between the separation layer 302 and the insulating layer 303. It is to be noted that separation can be carried out easily in a later separation step when the metal oxide is formed at the interface between the separation layer 302 and the insulating layer 303.

Next, after removing the crystalline silicon film, the bit lines 304e to 304g are formed. Here, the bit lines 304e to 304g are formed in such a way that a 60-nm-thick titanium layer, a 40-nm-thick titanium nitride layer, a 300-nm-thick aluminum layer, a 60-nm-thick titanium layer, and a 40-nm-thick titanium nitride layer are stacked by a sputtering method and these layers are selectively etched by using a resist mask formed by a photolithography step. Here, the bit lines 304e to 304g are preferably formed with aluminum, which is a low-resistant material.

Subsequently, the first organic insulating layer 306 is formed over the bit lines 304e to 304g. Here, polyimide is applied, light-exposed, and developed and then the insulating layer 303 and the bit lines 304e to 304g are partially exposed, followed by baking at 300° C. for 30 minutes; thus, the first organic insulating layer 306 is formed.

Subsequently, the first electrode layers 307 to 309 are formed over the first organic insulating layer 306 and the exposed portions of the bit lines 304e to 304g. The first electrode layers 307 to 309 are formed in such a way that a 100-nm-thick titanium film is formed by a sputtering method and then the titanium film is selectively etched by using a resist mask formed by a photolithography step. Here, it is preferable to improve the uniformity of film thickness distribution of the first electrode layer.

Next, the second organic insulating layer 310 is formed over the first insulating layer and the first electrode layers 307 to 309. Here, the second organic insulating layer 310 is formed by using photosensitive polyimide, similarly to the first organic insulating layer. Even though depression and projection are formed on the surface of the bit lines 304e to 304g due to heating, the layer containing an organic compound can be formed over the first electrode layers 307 to 309 which are to be connected to the bit lines 304e to 304g through the second organic insulating layer 310. Even when the layer containing an organic compound is thin, involvement of depression and projection of the surface of the bit lines 304e to 304g can be suppressed; therefore, short-circuiting of the storage element prior to writing can be prevented.

Subsequently, the layer 311 containing an organic compound is formed over the first electrode layers 307 to 309 and the second organic insulating layer 310. Here, NPB is formed in 10 nm thick as the layer 311 containing an organic compound by using a metal mask.

Next, the second electrode layer 312d is formed over the layer 311 containing an organic compound and the insulating layer 303.

Here, the second electrode layer 312d is formed so that the region 313 is formed where the insulating layer 303 is in contact with the second electrode layer 312d. In the region where the insulating layer 303 is in contact with the second electrode layer 312d, the adhesion between the insulating layer 303 and the second electrode layer 312d is so high that the separation layer and the insulating layer can be separated from each other with high yield in a later separation step.

Subsequently, after forming the insulating layer 331 over the second electrode layer 312d, the substrate 332 having an adhesive layer is attached over the insulating layer 331. Here, an epoxy resin is used as the insulating layer 331.

Next, after attaching the substrate having an adhesive layer over the surface of the substrate 301, the adhesive layer of the substrate 332 is plasticized by being heated at 120 to 150° C.; thus, the substrate 332 is attached to the insulating layer 331.

Figure 12B:
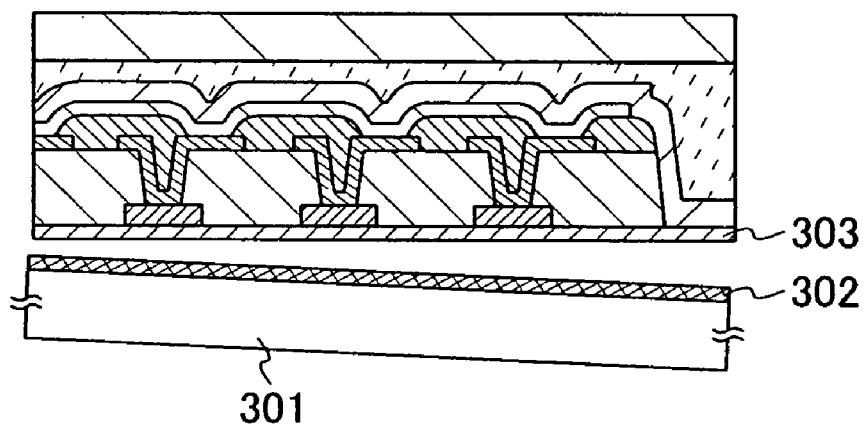

Then, the substrate 301 is provided over a flat surface, a roller (not shown) having a sticky layer is attached to the surface of the substrate 332 while applying pressure thereto, and then separation is carried out at an interface between the separation layer 302 and the insulating layer 303 as shown in FIG. 12B.

Figure 12C:
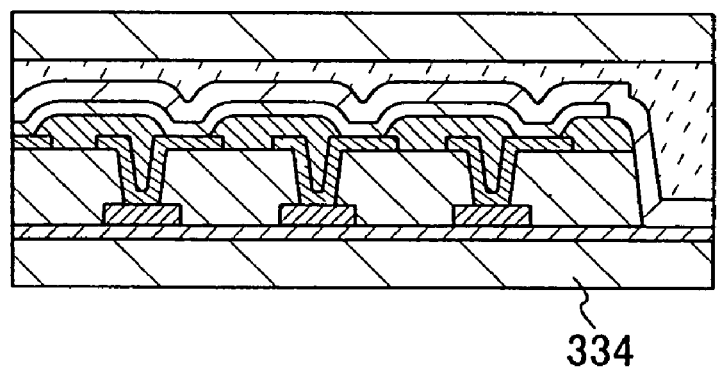
Figure 13A:
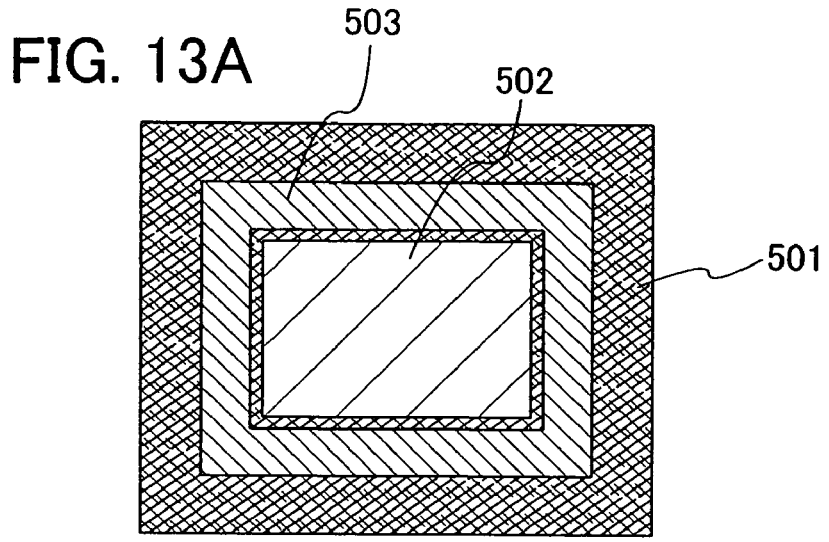
FIGS. 13A to 13C are top views describing semiconductor devices of the present invention.
Figure 13B:
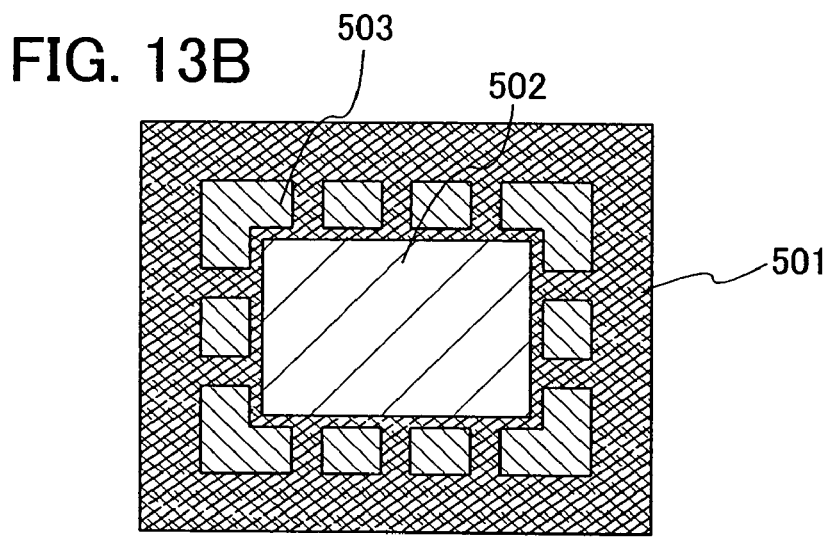
Figure 13C:
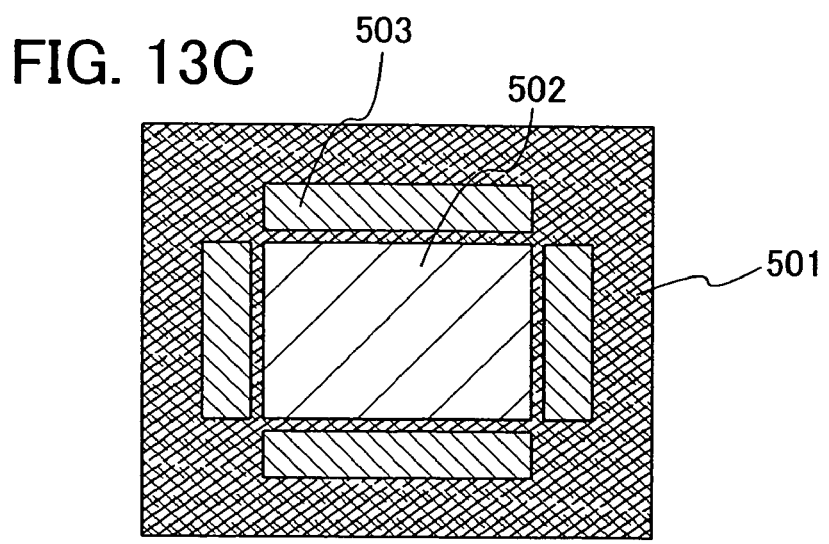

Subsequently, as shown in FIG. 12C, the substrate 334 having an adhesive layer, here a plastic film, is attached to the surface of the insulating layer 303 and heated at 120 to 150° C. so that the adhesive layer of the substrate 334 is plasticized. Thus, the substrate 334 is attached to the surface of the insulating layer 303.

By the above steps, the passive matrix type semiconductor device provided over a plastic film can be manufactured. Any of Embodiment Modes 1 to 5 can be applied to this embodiment.

Next, operation at data writing in the storage element is described. Here, a case is described in which data writing is carried out by an electrical action, typically voltage application (see FIG. 10A). The writing is carried out by changing electrical characteristics of a memory cell, and it is assumed that an initial state of the memory cell (a state in which an electrical action is not applied) is data "0" and a state in which the electrical characteristics are changed is data "1".

In the case of writing data "1" in the memory cell 300, the memory cell 300 is selected by the decoders 23 and 24 and the selector 25. Specifically, a predetermined voltage of V2 is applied by the decoder 24 to a word line W3 connected to the memory cell 300. The bit line B3 connected to the memory cell 300 is connected to the reading/writing circuit 26 by the decoder 23 and the selector 25. Then, a writing voltage of V1 is outputted from the reading/writing circuit 26 to the bit line B3. Thus, a voltage Vw=V1−V2 is applied between the first electrode layer and the second electrode layer that constitute a part of the memory cell 300. By selecting the voltage Vw appropriately, the layer containing an organic compound provided between the electrode layers can be changed physically or electrically, thereby writing data "1". Specifically, the electrical resistance between the first electrode layer and the second electrode layer in a data "1" state at the reading operation voltage may be changed so as to be much smaller than that in a data "0" state. The voltage Vw is set in the range of 5 to 15 V or −15 to −5 V, and for example, selection may be made appropriately within the range of (V1, V2)=(0 V, 5 to 15 V) or (3 to 5 V, −12 to −2V).

The voltage is controlled so that the data "1" is not written in the memory cells connected to unselected word lines and unselected bit lines. For example, the unselected word lines and the unselected bit lines may be set in a floating state. Moreover, the first electrode layer and the second electrode layer need to correlate with each other so as to satisfy a characteristic capable of securing selectivity such as a diode characteristic.

Meanwhile, in the case of writing the data "0" in the memory cell 300, the electrical action is not applied to the memory cell 300. At circuit operation, for example, the memory cell 300 is selected by the decoders 23 and 24 and the selector 25, similarly to the case of writing the data "1", but the output potential from the reading/writing circuit 26 to the bit line B3 is set to be similar to the potential of the selected word line W3 or the potential of the unselected word line. Moreover, a voltage of such a degree that the electrical characteristics of the memory cell 300 do not change (for example −5 to 5 V) may be applied between the first electrode layer and the second electrode layer that constitute a part of the memory cell 300.

Figure 10B:
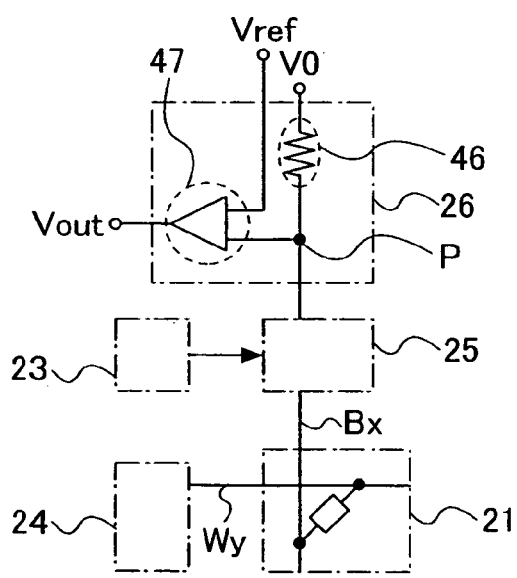
Figure 10C:
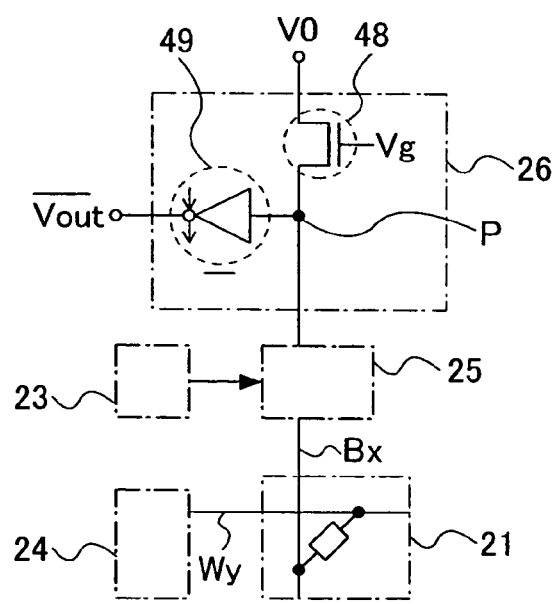

Subsequently, an operation at data reading from the storage element is described with reference to FIGS. 10A to 10C. The data reading is carried out by utilizing the fact that a memory cell having a data "0" and a memory cell having a data "1" have different electrical characteristics between the first electrode layer and the second electrode layer that constitute a part of the memory cell. For example, a method of reading by using the difference in the effective electrical resistance will be described assuming that the electrical resistance between the first conductive layer and the second conductive layer that constitute a part of the memory cell having the data "0" (hereinafter this electrical resistance is referred to as the electrical resistance of the memory cell, simply) is R0 at the reading voltage and that of the memory cell having the data "1" is R1 at the reading voltage. It is to be noted that R1<R0. Here, the reading/writing circuit 26 includes a resistor element 46 and a differential amplifier 47 shown in FIG. 10B as a structure of a reading portion. The resistor element 46 has a resistance value Rr, and R1<Rr<R0. The resistor element 46 may be replaced by a transistor 48, and the differential amplifier may be replaced by a clocked inverter 49 (FIG. 10C). The clocked inverter 49 has a signal φ or an inverted signal φ inputted therein, where the signal or the inverted signal becomes "HIGH" when reading is carried out and "LOW" when reading is not carried out. The circuit structure is not restricted to those shown in FIGS. 10B and 10C.

When data is read from the memory cell 300, first, the memory cell 300 is selected by the decoders 23 and 24 and the selector 25. Specifically, a predetermined voltage of Vy is applied to the word line Wy connected to the memory cell 300 by the decoder 24. Moreover, the bit line Bx connected to the memory cell 300 is connected to a terminal P of the reading/writing circuit 26 by the decoder 23 and the selector 25. Accordingly, the terminal P has a potential Vp, which is obtained by Vy and V0. The Vy and V0 are determined by resistance division by the resistor element 46 (resistance value Rr) and the memory cell 300 (resistance value R0 or R1). Therefore, if the memory cell 300 has the data "0", Vp0=Vy+(V0−Vy)×R0/(R0+Rr). If the memory cell 300 has the data "1", Vp1=Vy+(V0−Vy)×R1/(R1+Rr). As a result, by selecting Vref so as to be between Vp0 and Vp1 in FIG. 10B and selecting a point of change of the clocked inverter so as to be between Vp0 and Vp1, LOW/HIGH (or HIGH/LOW) is outputted as the output potential Vout in accordance with the data "0"/"1".

For example, the differential amplifier is operated at Vdd=3 V, and Vy is set to be 0 V, V0 is set to be 3 V, and Vref is set to be 1.5 V. If R0/Rr=Rr/R1=9, Vp0=2.7 V and "HIGH" is outputted as Vout when the memory cell has the data "0", while Vp1=0.3 V and "LOW" is outputted as Vout when the memory cell has the data "1". Thus, the reading from the memory cell can be carried out.

According to the above method, the state of the electrical resistance of the layer containing an organic compound is read out by a voltage value using the difference in the resistance value and the resistance division. However, the reading method is not restricted to this method. For example, besides the method using the difference in the electrical resistance, a difference in a current value may be used for the reading. If the electrical characteristics of the memory cell are diode characteristics that the threshold voltage is different at the data "0" and the data "1", the data reading may be carried out by using a difference in the threshold voltage.

In the case of applying voltage to the first electrode layer and the second electrode layer of the storage element, it is preferable that a resistor be connected serially to the storage element. The resistor preferably has a resistance value of 5% or lower of that of the storage element. Accordingly, in the short-circuited storage element, excessive current flow can be prevented. Thus, it is possible to prevent the storage element from being broken by excessive current flow.

Thin film transistors (TFTs) may be provided over the inorganic insulating layer 103 and the memory cell 300 or the memory cell array 22 may be provided over the TFTs. Moreover, field effect transistors (FETS) may be formed using a semiconductor substrate made of Si or the like or an SOI substrate, which is used instead of the insulating substrate, and the memory cell 300 or the memory cell array 22 may be provided over the FETs.

By applying the present invention, separation can be carried out at an interface of the separation layer instead of the layer containing an organic compound of the storage element. Thus, it is possible to separate the layer having the storage element formed over the substrate having heat resistance and to provide the layer over a flexible substrate. Further, it is possible to write (additionally record) data at a time other than during manufacturing a chip but impossible to rewrite the data, in a semiconductor device having the storage element of this embodiment. Thus, forgery due to rewriting can be prevented. Moreover, since the semiconductor device of the present invention has a storage element having a simple structure in which an organic compound layer is sandwiched between a pair of conductive layers, the semiconductor device can be inexpensive.

Embodiment 2

This embodiment will describe a method for manufacturing a semiconductor device having an organic thin film transistor as an element which has a layer containing an organic compound.

Figure 14A:
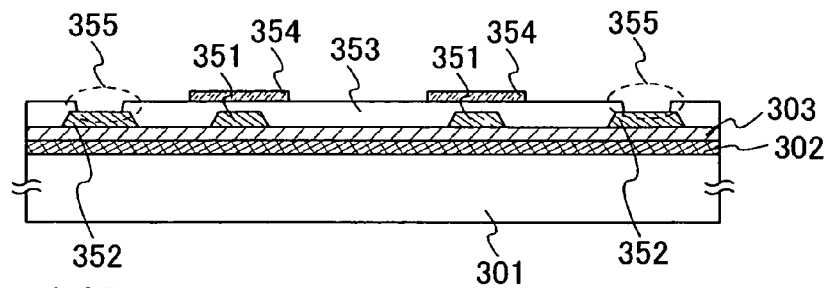
FIGS. 14A to 14E are cross-sectional views describing manufacturing steps of a semiconductor device of the present invention.

As shown in FIG. 14A, the separation layer 302 is formed in 30 nm thick over the substrate 301 and the insulating layer 303 is formed over the separation layer 302, similarly to Embodiment 1. Next, an amorphous silicon film is formed over the insulating layer 303 and heated to form a crystalline silicon film as well as a metal oxide layer at an interface between the separation layer 302 and the insulating layer 303. Separation can be carried out easily in a later separation step by forming the metal oxide layer at the interface between the separation layer 302 and the insulating layer 303. After that, the crystalline silicon film is removed. Next, a first electrode layer 351 and a conductive layer 352 are formed over the insulating layer 303. Here, after forming an aluminum layer by a sputtering method, the aluminum layer is selectively etched by using a resist mask formed by a photolithography step to form the first electrode layer 351 and the conductive layer 352. The first electrode layer 351 functions as a gate electrode. Further, the first electrode layer 351 and the conductive layer 352 are not connected to each other.

Subsequently, an insulating layer 353 is formed over the first electrode layer 351 and the conductive layer 352. Here, the insulating layer 353 is formed with polyimide so that the conductive layer 352 is partially exposed. In FIG. 14A, a reference numeral 355 denotes an exposed part of the insulating layer 353. It is to be noted that the insulating layer 353 functions as a gate insulating layer.

Next, a layer 354 containing an organic compound is formed over a portion where the insulating layer 353 overlaps with the first electrode layer 351, by an evaporation method. Here, the layer 354 containing an organic compound is formed by evaporating pentacene using a metal mask.

Figure 14B:
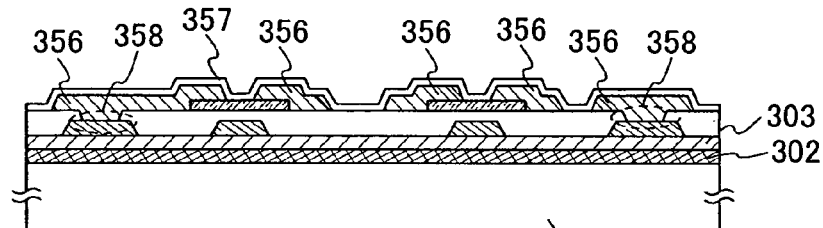

Next, as shown in FIG. 14B, a second electrode layer 356 is formed over the exposed portion 355 of the conductive layer 352, the insulating layer 353, and the layer 354 containing an organic compound. Here, the second electrode layer 356 is formed with gold by an evaporation method. At this time, a region 358 is formed where the conductive layer 352 is in contact with the second electrode layer 356. In the region 358 where the conductive layer 352 is in contact with the second electrode layer 356, the adhesion between the conductive layer 352 and the second electrode layer 356 is so high that separation does not occur between the layer 354 containing an organic compound and the second electrode layer 356 in a later separation step, and separation can be carried out at the separation layer 302 and the insulating layer 303. Moreover, the second electrode layer 356 functions as a source electrode (source wire) and a drain electrode (drain wire). Subsequently, a protective layer 357 is formed over the insulating layer 353, the layer 354 containing an organic compound, and the second electrode layer 356.

Figure 14C:
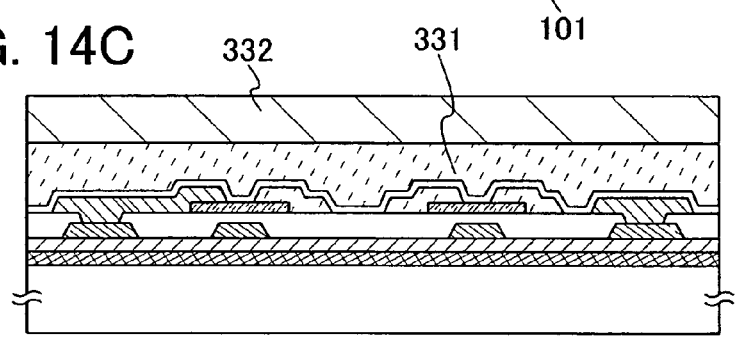
Figure 14D:
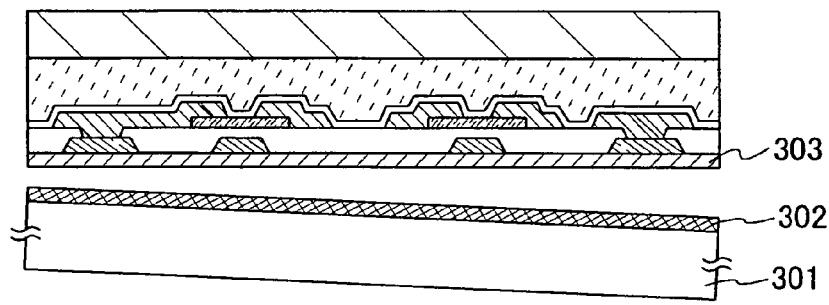
Figure 14E:
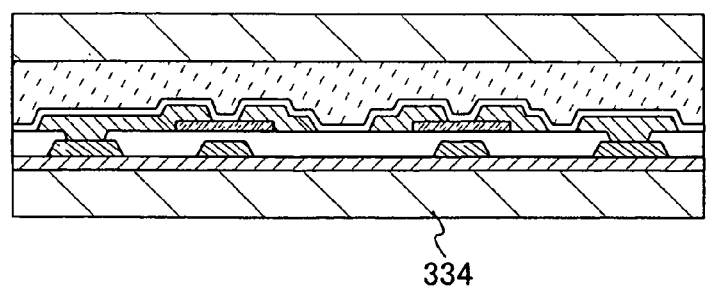

Since the formation of the insulating layer 331 and the attaching of the substrate 332 which are shown in FIG. 14C, the separation step shown in FIG. 14D, and the attaching of the substrate 334 shown in FIG. 14E are similar to those in Embodiment 1, the description thereof is omitted here.

In this embodiment, any of Embodiment Modes 1 to 5 can be applied.

Embodiment 3

This embodiment will describe a method for manufacturing a semiconductor device having an organic solar cell as an element which has a layer containing an organic compound.

Figure 15A:
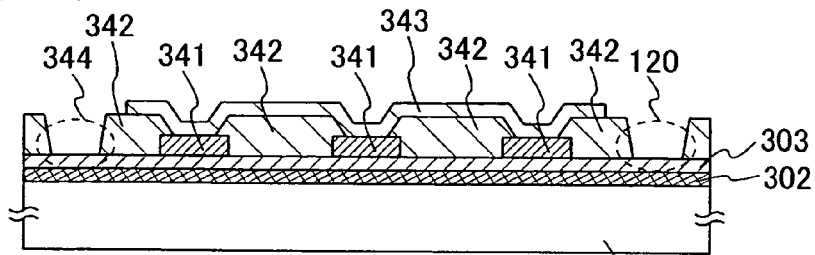
FIGS. 15A to 15E are cross-sectional views describing manufacturing steps of a semiconductor device of the present invention.

As shown in FIG. 15A, the separation layer 302 is formed in 30 nm thick over the substrate 301 and the insulating layer 303 is formed over the separation layer 302, similarly to Embodiment 1.

Next, an amorphous silicon film is formed over the insulating layer 303 and heated to form a crystalline silicon film as well as a metal oxide layer is formed at an interface between the separation layer 302 and the insulating layer 303. After that, the crystalline silicon film is removed. Then, a first electrode layer 341 is formed over the insulating layer 303. Here, after forming an ITO film by a sputtering method, the ITO film is selectively etched by using a resist mask formed by a photolithography step to form the first electrode layer 341.

Next, an insulating layer 342 is formed over the first electrode layer 341. Here, the insulating layer 342 is formed with polyimide. The insulating layer 342 is formed so as to partially expose the electrode layer 341. In FIG. 15A, a reference numeral 344 denotes an exposed portion of the insulating layer 303.

Next, a layer 343 containing an organic compound is formed over a part of the insulating layer 342 and the first electrode layer 341 by an evaporation method using a metal mask. Here, the layer 343 containing an organic compound is formed by stacking a first layer containing an inorganic compound and an organic compound having a hole-transporting property and a second layer containing an organic compound having an electron-transporting property. The first layer containing an inorganic compound and an organic compound having a hole-transporting property is formed by co-evaporating molybdenum trioxide ($MoO_3$) and NPB, which is aromatic amine, with a molar ratio of 1:1. The second layer containing an organic compound having an electron-transporting property is formed by evaporating fullerene (C60).

Figure 15B:
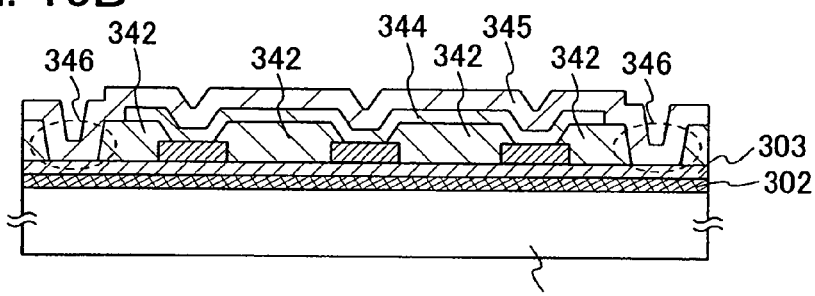

Subsequently, as shown in FIG. 15B, a second electrode layer 345 is formed over the exposed portion 344 of the insulating layer 303, the insulating layer 342, and the layer 343 containing an organic compound. Here, the second electrode layer 345 is formed with aluminum by an evaporation method. At this time, a region 346 is formed where the insulating layer 303 is in contact with the second electrode layer 345. In the region 346 where the insulating layer 303 is in contact with the second electrode layer 345, the adhesion between the insulating layer 303 and the second electrode layer 345 is so high that separation does not occur between the layer 343 containing an organic compound and the second electrode layer 345 in a later separation step, and separation can be carried out at the separation layer 302 and the insulating layer 303.

Figure 15C:
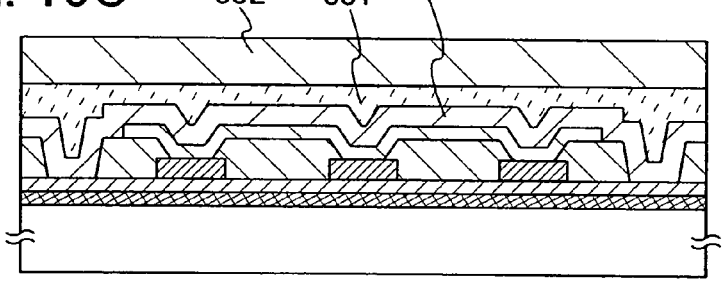
Figure 15D:
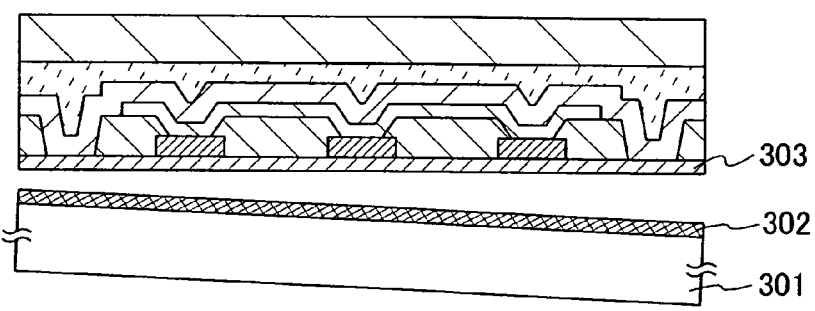
Figure 15E:
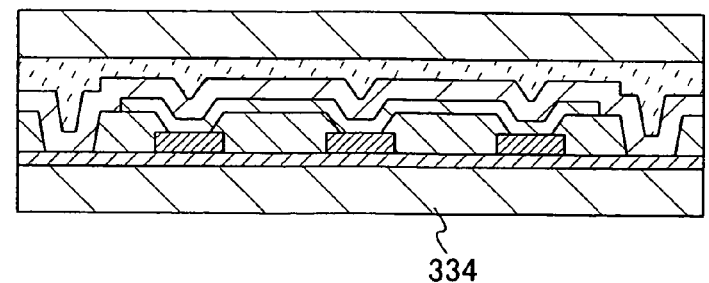

Since the formation of the insulating layer 331 and the attaching of the substrate 332 which are shown in FIG. 15C, the separation step shown in FIG. 15D, and the attaching of the substrate 334 shown in FIG. 15E are similar to those in Embodiment 1, the description thereof is omitted here.

In this embodiment, any of Embodiment Modes 1 to 5 can be applied.

The solar cell of this embodiment can be provided as a battery for various kinds of illumination appliances, illumination apparatuses, illumination instruments for home use, outdoor lamps, street lights, unmanned public facilities, personal computers, game machines, navigation systems, mobile audio appliances, portable AV appliances, cameras such as digital cameras, film cameras, and instant cameras, calculators, wristwatches, wall clocks, and the like. In the case of providing the battery for a wristwatch, design quality thereof can be improved by providing the battery under a face.

Embodiment 4

Figure 16A:
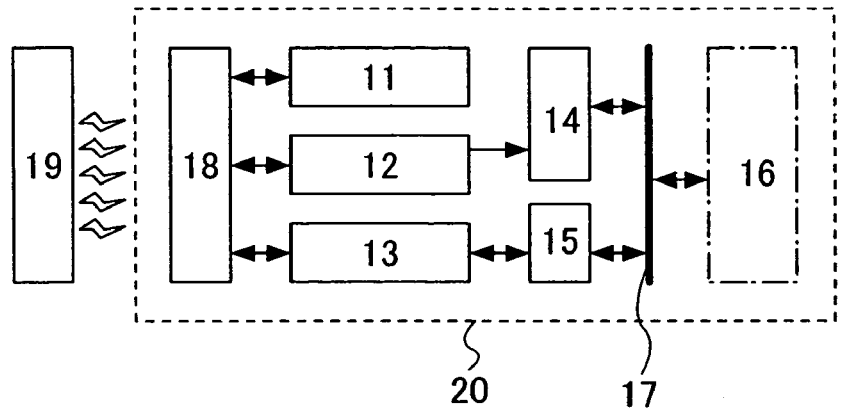
FIGS. 16A to 16C describe semiconductor devices of the present invention.

Here, a structure of a semiconductor device of the present invention is described with reference to FIGS. 16A to 16C. A semiconductor device 20 of the present invention has a function to send and receive data without contact, and has a power source circuit 11, a clock generating circuit 12, a data modulating/demodulating circuit 13, a controlling circuit 14 which controls another circuit, an interface circuit 15, a storage circuit 16, a bus 17, and an antenna 18 as shown in FIG. 16A.

Figure 16B:
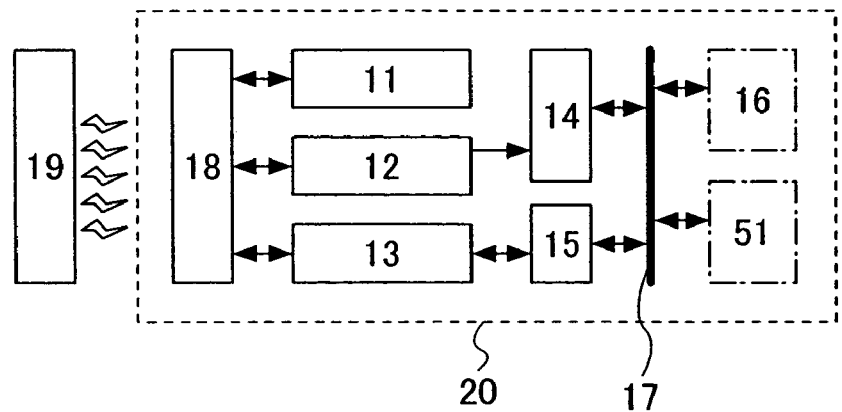

As shown in FIG. 16B, the semiconductor device 20 of the present invention has a function to send and receive data without contact, and may have a central processing unit 51, in addition to the power source circuit 11, the clock generating circuit 12, the data modulating/demodulating circuit 13, the controlling circuit 14 which controls another circuit, the interface circuit 15, the storage circuit 16, the bus 17, and the antenna 18.

Figure 16C:
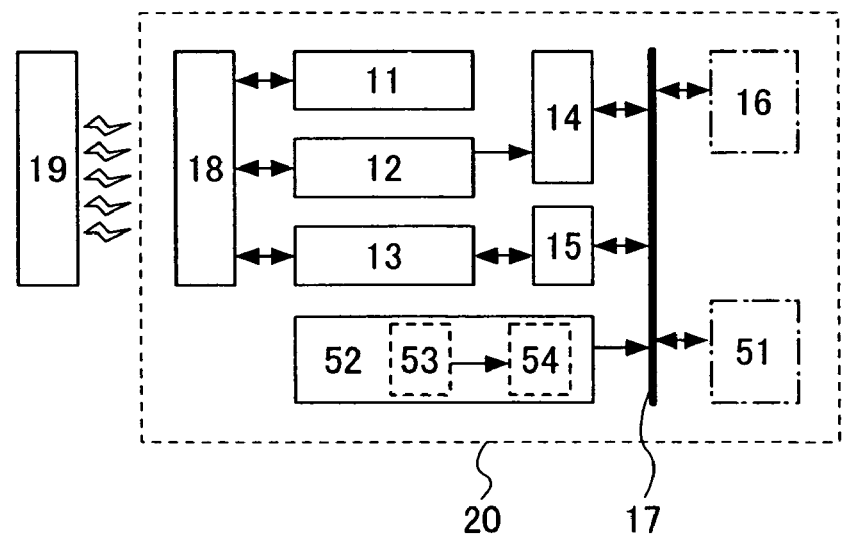

Moreover, as shown in FIG. 16C, the semiconductor device 20 of the present invention has a function to send and receive data without contact, and may have a detection portion 52 including a detection element 53 and a detection controlling circuit 54, in addition to the power source circuit 11, the clock generating circuit 12, the data modulating/demodulating circuit 13, the controlling circuit 14 which controls another circuit, the interface circuit 15, the storage circuit 16, the bus 17, the antenna 18, and the central processing unit 51.

In the semiconductor device of this embodiment, the detection portion 52 including the detection element 53 and the detection controlling circuit 54 and the like are formed in addition to the power source circuit 11, the clock generating circuit 12, the data modulating/demodulating circuit 13, the controlling circuit 14 which controls another circuit, the interface circuit 15, the storage circuit 16, the bus 17, the antenna 18, and the central processing unit 51. This structure makes it possible to form a compact and multi-functional semiconductor device.

The power source circuit 11 is a circuit generating various power sources to be supplied to each circuit in the semiconductor device 20 based on an alternating signal inputted from the antenna 18. Moreover, the power source circuit 11 may have one or more solar cells shown in any of Embodiment Modes 1 to 5. The clock generating circuit 12 is a circuit generating various clock signals to be supplied to each circuit in the semiconductor device 20 based on an alternating signal inputted from the antenna 18. The data modulating/demodulating circuit 13 has a function to modulate/demodulate data to be sent to or received from a reader/writer 19. The controlling circuit 14 has a function to control the storage circuit 16. The antenna 18 has a function to send and receive an electromagnetic wave or an electric wave. The reader/writer 19 sends and receives data to and from the semiconductor device, controls the semiconductor device, and controls the process of the data sent to or received from the semiconductor device. The semiconductor device is not restricted to the above structure, and for example, another element such as a limiter circuit of power source voltage or hardware only for processing codes may be added.

The storage circuit 16 has one or more elements selected from the storage elements shown in Embodiment Modes 1 to 5. The storage element which has the layer containing an organic compound can achieve downsizing, film thinning, and capacity increasing at the same time; therefore, when the storage circuit 16 is provided by using the storage element which has the layer containing an organic compound, the reduction in size and weight of the semiconductor device can be achieved.

The detection portion 52 can detect temperature, pressure, flow rate, light, magnetism, sound wave, acceleration, humidity, gas constituent, liquid constituent, and other characteristics by a physical or chemical means. Moreover, the detection portion 52 has the detection element 53 for detecting a physical quantity or a chemical quantity and the detection controlling circuit 54 for converting the physical quantity or the chemical quantity detected by the detection element 53 into an appropriate signal such as an electrical signal. As the detection element 53, it is possible to use a resistor element, a capacitively coupled element, an inductively coupled element, a photovoltaic element, a photoelectric conversion element, a thermo-electromotive force element, a transistor, a thermistor, a diode, or the like, and one or more elements selected from the photoelectric conversion elements shown in any of Embodiment Modes 1 to 5 can be used. The number of detection portions 52 may be more than one and, in such a case, it is possible to detect a plurality of physical quantities or chemical quantities simultaneously.

The physical quantity described here means temperature, pressure, flow rate, light, magnetism, sound wave, acceleration, humidity, and the like, while the chemical quantity means a chemical substance such as a gas constituent or a constituent included in a liquid such as an ion, or the like. In addition, an organic compound such as a particular biological substance included in blood, sweat, urine, or the like (for example, blood-sugar level in the blood) is also included. In particular, in the case of detecting the chemical quantity, since a particular substance is to be selectively detected by necessity, a substance which selectively reacts with the substance to be detected is provided in advance in the detection element 53. For example, in the case of detecting a biological substance, it is preferable to fix, in a high molecular compound or the like, an enzyme, an antibody molecule, a microbial cell, or the like which selectively reacts with the biological substance to be detected by the detection element 53.

Figure 17A:
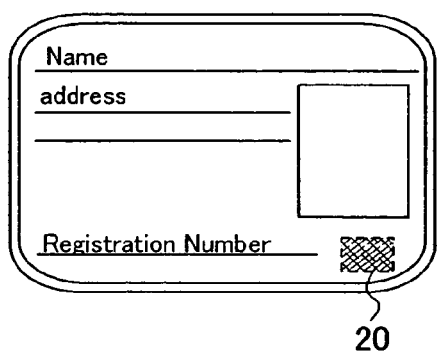
FIGS. 17A to 17F describe usage of semiconductor devices of the present invention.
Figure 17B:
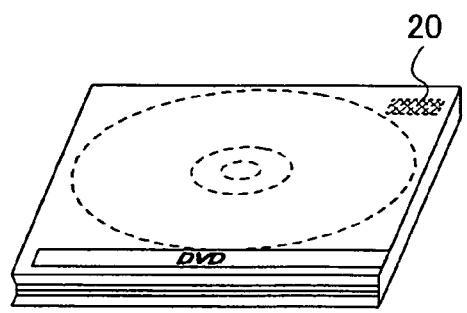
Figure 17C:
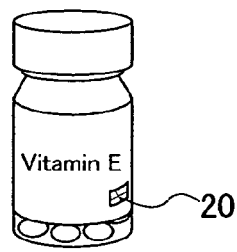
Figure 17D:
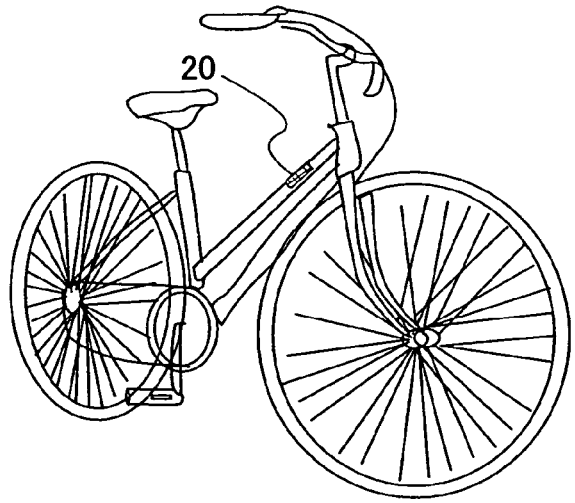
Figure 17E:
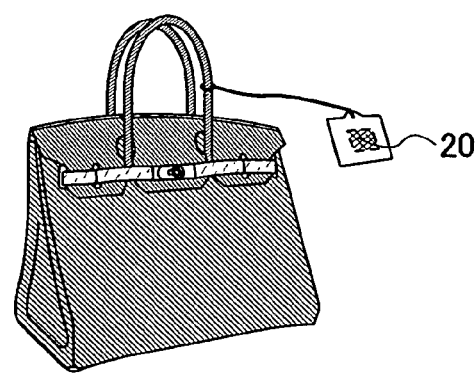
Figure 17F:
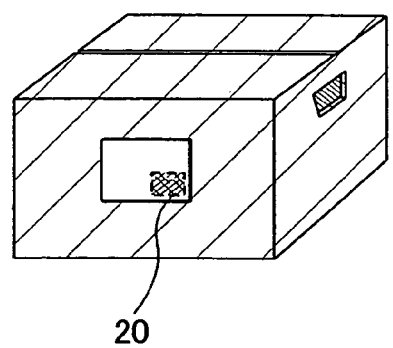

A semiconductor device functioning as a wireless chip can be formed according to the present invention. The wireless chip is applicable in a wide range. For example, the wireless chip can be applied to banknotes, coins, securities, bearer bonds, identification certificates (driver's license, certificate of residence, and the like, see FIG. 17A), containers for package (package paper, bottles, and the like, see FIG. 17C), recording media (DVD software, video tapes, and the like, see FIG. 17B), vehicles (bicycles and the like, see FIG. 17D), personal belongings (bags, glasses, and the like), foods, plants, animals, human bodies, clothes, commodities, electronic appliances, baggage tags (see FIGS. 17E and 17F), and the like. The electronic appliances include a liquid crystal display device, an EL display device, a television device (also referred to as simply a TV, a TV receiving machine, or a television receiving machine), a mobile phone, and the like.

The semiconductor device 20 of the present invention is fixed to a product by attaching the semiconductor device 20 to the surface of the product or embedding it inside the product. For example, if the product is a book, the semiconductor device 20 is fixed to the book by embedding it inside a paper, and if the product is a package made of an organic resin, the semiconductor device 20 is fixed to the package by embedding it inside the organic resin. Since the semiconductor device 20 of the present invention can be compact, thin, and lightweight, the design quality of the product itself is not degraded even after the device is fixed to the product. By providing the semiconductor device 20 to banknotes, coins, securities, bearer bonds, identification certificates, and the like, a certification function can be provided and the forgery can be prevented by using the certification function. Moreover, when the semiconductor device of the present invention is provided in containers for package, recording media, personal belongings, foods, clothes, commodities, electronic appliances, and the like, systems such as an inspection system can become more efficient.

Embodiment 5

This embodiment will describe steps of manufacturing a semiconductor device having a light-emitting element.

Figure 18A:
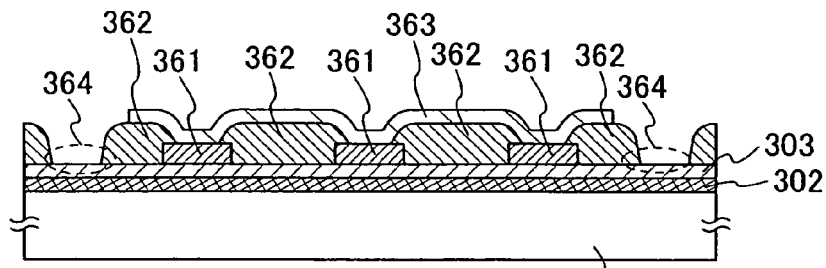
FIGS. 18A to 18E are cross-sectional views describing manufacturing steps of a semiconductor device of the present invention.

As shown in FIG. 18A, the separation layer 302 is formed in 30 nm thick over the substrate 301 and the insulating layer 303 is formed over the separation layer 302, similarly to Embodiment 1. Subsequently, an amorphous silicon film is formed over the insulating layer 303 and heated to form a crystalline silicon film as well as a metal oxide layer is formed at an interface between the separation layer 302 and the insulating layer 303. After that, the crystalline silicon film is removed. Next, a first electrode layer 361 is formed over the insulating layer 303. Here, after forming an ITO film by a sputtering method, the ITO film is selectively etched by using a resist mask formed by a photolithography step to form the first electrode layer 361.

Next, an insulating layer 362 is formed over the first electrode layer 361. Here, the insulating layer 362 is formed with photosensitive polyimide. The insulating layer 362 is formed so as to partially expose the electrode layer 361. In FIG. 18A, a reference numeral 364 denotes an exposed portion of the insulating layer 303.

Subsequently, a layer 363 containing an organic compound is formed over a part of the insulating layer 362 and the first electrode layer 361 by an evaporation method using a metal mask. Here, the layer 363 containing an organic compound is formed with an organic compound having a light-emitting property. A pixel having a red-light-emitting property, a pixel having a blue-light-emitting property, and a pixel having a green-light-emitting property are formed by using an organic compound having a red-light-emitting property, an organic compound having a blue-light-emitting property, and an organic compound having a green-light-emitting property, respectively for the layer 363 containing an organic compound.

Here, as the layer containing an organic compound having a red-light-emitting property, DNTPD with a thickness of 50 nm, NPB with a thickness of 10 nm, NPB doped with bis[2,3-bis(4-fluorophenyl)quinoxalinato]iridium(acetylacetonate) (abbreviation: Ir(Fdpq)$_2$(acac)) with a thickness of 30 nm, Alq$_3$ with a thickness of 60 nm, and LiF with a thickness of 1 nm are stacked.

Here, as the layer containing an organic compound having a green-light-emitting property, DNTPD with a thickness of 50 nm, NPB with a thickness of 10 nm, Alq$_3$ doped with coumarin 545T (C545T) with a thickness of 40 nm, Alq$_3$ with a thickness of 60 nm, and LiF with a thickness of 1 nm are stacked.

Here, as the layer containing an organic compound having a blue-light-emitting property, DNTPD with a thickness of 50 nm, NPB with a thickness of 10 nm, 9-[4-(N-carbazolyl)]phenyl-10-phenylanthracene (abbreviation: CzPA) doped with 2,5,8,11-tetra(tert-butyl)perylene (abbreviation: TBP) with a thickness of 30 nm, Alq$_3$ with a thickness of 60 nm, and LiF with a thickness of 1 nm are stacked.

Moreover, a pixel having a white-light-emitting property may be formed by using an organic compound having a white-light-emitting property. By providing a pixel having a white-light-emitting property, power consumption can be reduced.

Figure 18B:
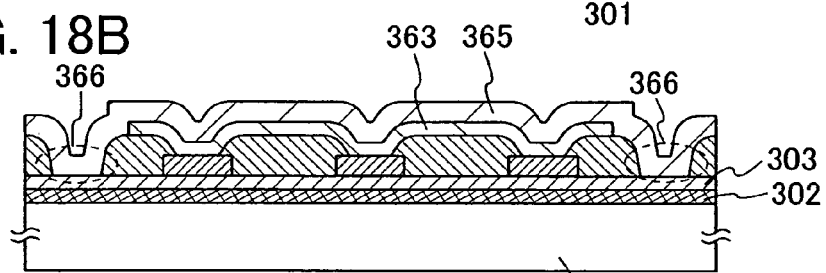

Next, as shown in FIG. 18B, a second electrode layer 365 is formed over the layer 363 containing an organic compound, the insulating layer 362, and the insulating layer 303. Here, an Al film with a thickness of 200 nm is formed by an evaporation method. At this time, a region 366 is formed where the insulating layer 303 formed with an inorganic compound is in contact with the second electrode layer 365. In the region 366 where the insulating layer 303 is in contact with the second electrode layer 365, the adhesion between the insulating layer 303 and the second electrode layer 365 is so high that separation does not occur between the layer 363 containing an organic compound and the second electrode layer 365 in a later separation step, and in consequence, it is achieved that separation is carried out at the separation layer 302 and the insulating layer 303.

Figure 18C:
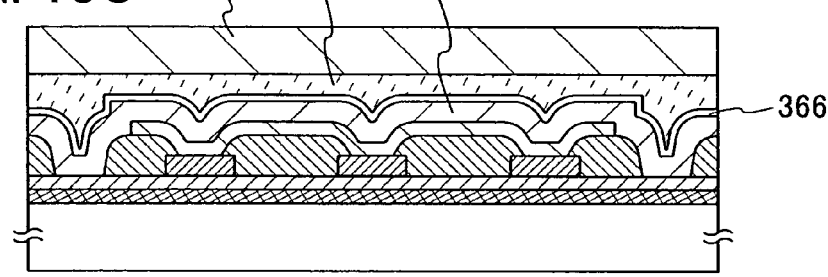

Next, as shown in FIG. 18C, a protective layer 367 is formed over the second electrode layer 365. The protective layer is to prevent the intrusion of moisture, oxygen, and the like into the light-emitting element and the insulating layer 362. The protective layer 367 is preferably formed with silicon nitride, silicon oxide, silicon nitride oxide, silicon oxynitride, aluminum oxynitride, aluminum oxide, diamond-like carbon (DLC), carbon containing nitrogen (CN), and other insulating materials by a thin-film forming method such as a plasma CVD method or a sputtering method.

Figure 18D:
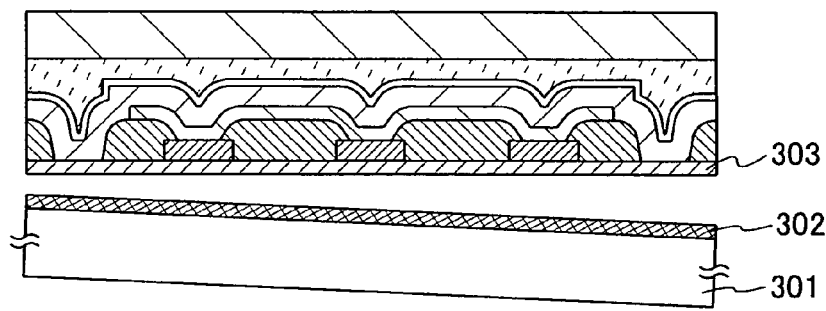
Figure 18E:
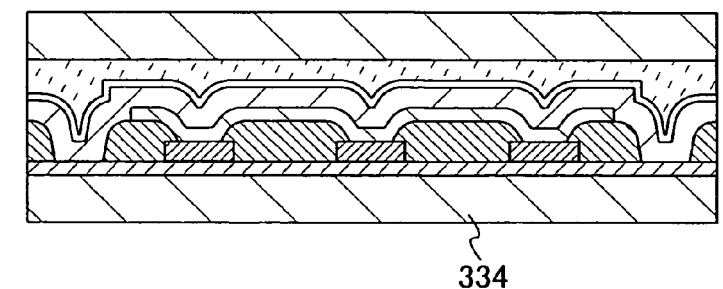

Since the formation of the insulating layer 331 and the attaching of the substrate 332 which are shown in FIG. 18C, the separation step shown in FIG. 18D, and the attaching of the substrate 334 shown in FIG. 18E are similar to those in Embodiment 1, the description thereof is omitted here.

By the aforementioned steps, a semiconductor device having a passive matrix type light-emitting element provided over a plastic film can be manufactured.

In this embodiment, any of Embodiment Modes 1 to 5 can be applied.

Embodiment 6

An example will be described in which an FPC or a driver IC is mounted onto the EL display panel shown in Embodiment 5. Here, a chip-like driver circuit formed by TFTs is referred to as a driver IC.

Figure 19:
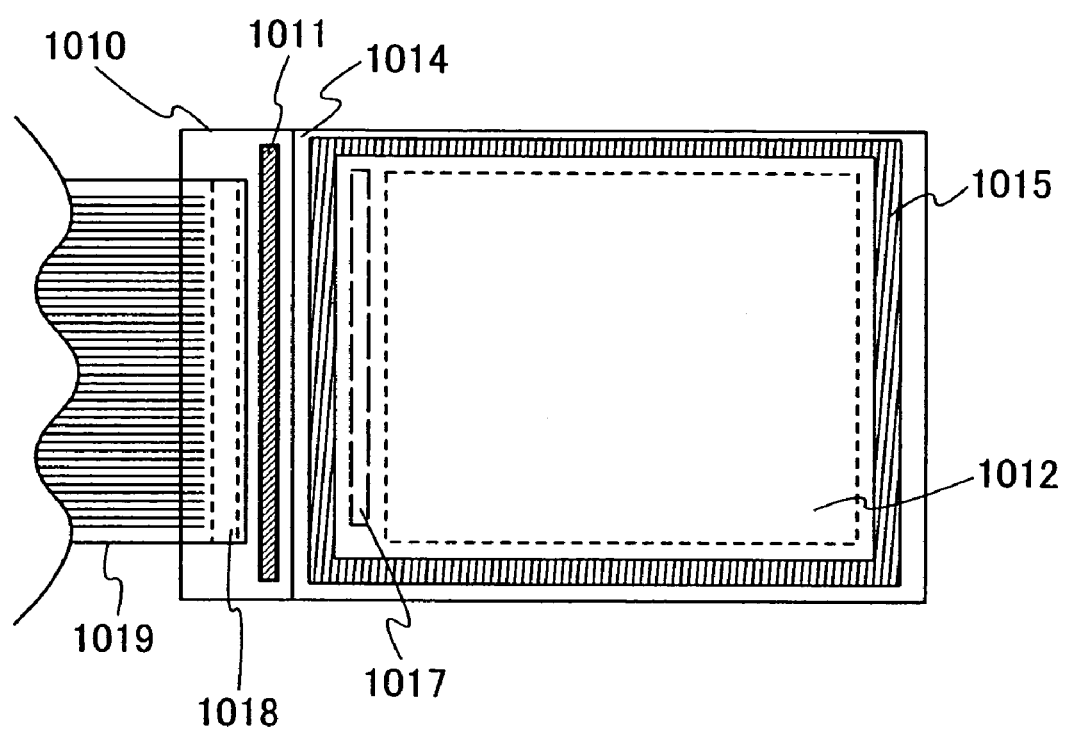
FIG. 19 is a top view describing a semiconductor device of the present invention.

A structure shown in FIG. 19 is an example employing a COG method, which is preferable for a compact size with a narrowed frame (for example, 1.5 inch diagonal).

In FIG. 19, a driver IC 1011 is mounted on a substrate 1010, and an FPC 1019 is mounted on a terminal portion 1018 positioned at an end of the driver IC. In order to improve the productivity, it is preferable to manufacture a plurality of driver ICs 1011 over a rectangular substrate with a length of 300 mm to 1000 mm on one side. In other words, a plurality of circuit patterns each including a driver circuit portion and an input/output terminal as one unit are formed over a substrate and then the substrate is divided so that the driver ICs are taken out individually. The driver IC may have a rectangular shape with a length of 15 to 80 mm on a long side and 1 to 6 mm on a short side in consideration of the length of one side of a pixel portion and a pixel pitch.

The superiority of the outside dimension of the driver IC to the IC chip lies in the length of the long side. When the driver IC has a long side of 15 to 80 mm, the number of chips to be mounted can be fewer than that in the case of using the IC chip, thereby increasing the yield of the production. When the driver IC is formed over a glass substrate, the shape of the substrate used as a base material is not limited and the productivity is not lowered. This is a great advantage in comparison with the case of taking IC chips from a circular silicon wafer.

Further, a TAB method is also applicable. In a TAB method, a plurality of tapes may be pasted and the driver ICs may be mounted on the tapes. Similarly to the COG method, a single driver IC may be mounted on a single tape. In such a case, a metal chip or the like for fixing the driver IC is preferably pasted in point of the strength.

A connection region 1017 provided between a pixel portion 1012 and the driver IC 1011 is provided so that the second electrode layer of the light-emitting element is in contact with wires of a lower layer.

A sealing substrate 1014 is fixed to the substrate 1010 by a sealing material 1015 surrounding the pixel portion 1012 and a filling material surrounded by the sealing material.

It is to be noted that the driver IC may be replaced by an IC chip formed by Si.

Thus, various electronic appliances can be completed by using the structure of the light-emitting element of Embodiment 5.

Embodiment 7

Figure 20:
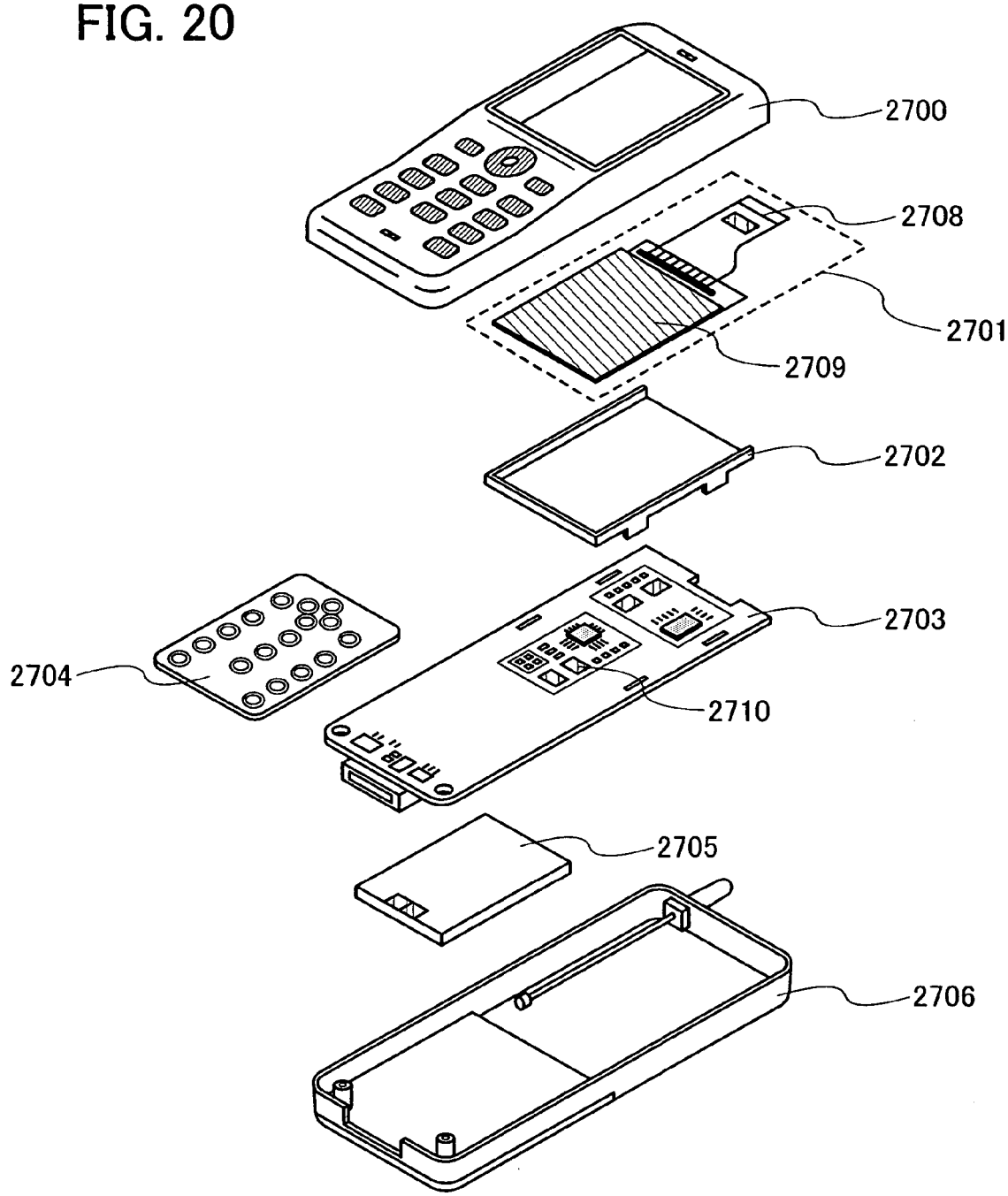
FIG. 20 is a development view describing a semiconductor device of the present invention.
Figure 21:
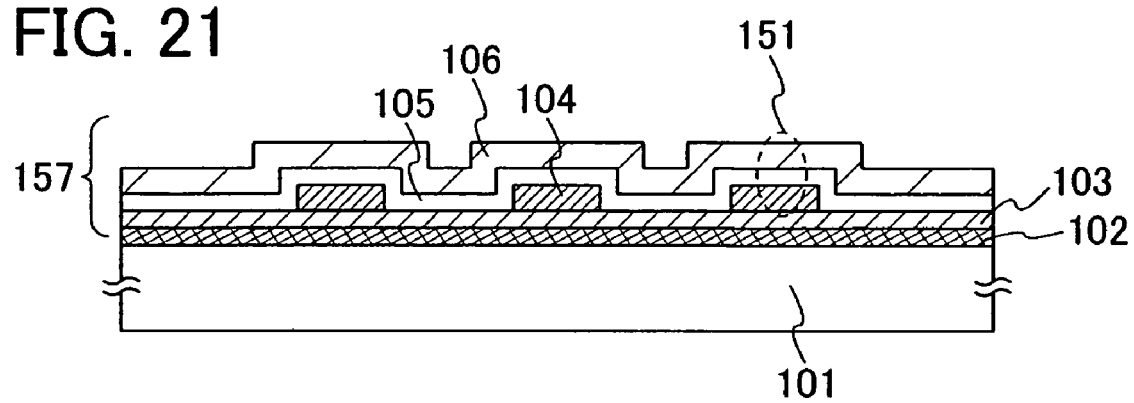
FIG. 21 is a cross-sectional view describing a conventional semiconductor device.

An aspect of an electronic appliance on which a semiconductor device of the present invention is mounted will be described with reference to drawings. An electronic appliance shown as the example here is a mobile phone including cases 2700 and 2706, a panel 2701, a housing 2702, a printed wiring board 2703, operation buttons 2704, and a battery 2705 (see FIG. 20). The panel 2701 is detachably incorporated into the housing 2702 and the housing 2702 is fitted into the printed wiring board 2703. The shape and size of the housing 2702 are appropriately modified in accordance with an electronic appliance to which the panel 2701 is to be incorporated. The printed wiring board 2703 has a plurality of packaged semiconductor devices mounted thereon. A semiconductor device 2710 of the present invention can be used as one of the packaged semiconductor devices. The plurality of semiconductor devices mounted on the printed wiring board 2703 have any function of a controller, a central processing unit (CPU), a memory, a power source circuit, an audio processing circuit, a sending/receiving circuit, and the like.

The panel 2701 is connected to the printed wiring board 2703 through a connection film 2708. The panel 2701, the housing 2702, and the printed wiring board 2703 are included inside the cases 2700 and 2706 together with the operation buttons 2704 and the battery 2705. A pixel region 2709 in the panel 2701 is provided so as to be observed from an opening window provided in the case 2700. For the panel 2701, the semiconductor devices shown in Embodiments 5 and 6 can be used.

As aforementioned, the semiconductor device of the present invention has advantages of its compactness, thinness, and lightness in weight. These advantages allow efficient usage of limited space in the cases 2700 and 2706 of the electronic appliance.

The outer shapes of cases 2700 and 2706 are shown as one example of a mobile phone, and the electronic appliances of this embodiment can be modified variously in accordance with the function and purpose.

This application is based on Japanese Patent Application serial no. 2005-252876 filed in Japan Patent Office on Aug. 31, 2005, the entire contents of which are hereby incorporated by reference.

What is claimed is:
1. A method for manufacturing a semiconductor device, comprising steps of:
forming a separation layer over a substrate;
forming an inorganic compound layer on and in direct contact with the separation layer;
forming a first conductive layer on and in direct contact with the inorganic compound layer;
forming a layer containing an organic compound over the first conductive layer;
forming a second conductive layer over the layer containing the organic compound to form an element, wherein a portion of the second conductive layer is in direct contact with the inorganic compound layer through an opening in the layer containing the organic compound; and
separating the first and second conductive layers and the layer containing the organic compound from the substrate at the separation layer.

2. A method for manufacturing a semiconductor device according to claim 1, wherein the inorganic compound layer is an insulating layer.

3. A method for manufacturing a semiconductor device according to claim 1, wherein the inorganic compound layer is containing at least one of silicon oxide, silicon oxynitride, silicon nitride oxide, silicon nitride.

4. A method for manufacturing a semiconductor device according to claim 1, wherein the separation layer is formed from a layer containing at least one of tungsten, molybdenum, tungsten oxide, molybdenum oxide, tungsten oxynitride, molybdenum oxynitride.

5. A method for manufacturing a semiconductor device according to claim 1, wherein the second conductive layer is containing at least one of aluminum, an alloy of aluminum, europium, an alloy of europium, ytterbium, and an alloy of ytterbium, or at least one of indium tin oxide, indium tin oxide containing silicon, indium oxide containing 2 to 20 atomic % of zinc oxide, titanium, gold, platinum, nickel, tungsten, chromium, molybdenum, iron, cobalt, copper, palladium, titanium nitride, tungsten nitride, and molybdenum nitride.

6. A method for manufacturing a semiconductor device according to claim 1, wherein the layer containing the organic compound is a layer that changes in a crystal condition, conductivity, and a shape by applying voltage to the first conductive layer and the second conductive layer.

7. A method for manufacturing a semiconductor device according to claim 1, wherein the layer containing the organic compound includes a light emitting layer.

8. A method for manufacturing a semiconductor device according to claim 1, wherein the layer containing the organic compound is a layer generating photocurrent.

9. A method for manufacturing a semiconductor device according to claim 1, wherein the element is one of a storage element, a light-emitting element, a photoelectric conversion element, a solar cell, and a transistor.

10. A method for manufacturing a semiconductor device according to claim 1, comprising further step of:
forming an organic insulating film over the first conductive layer to cover an edge portion of the first conductive layer.

11. A method for manufacturing a passive matrix type semiconductor device comprising the steps according to claim 1.

12. A semiconductor device comprising:
a first substrate;
a separation layer provided over the first substrate;
an inorganic compound layer provided on and in direct contact with the separation layer;
a first conductive layer provided on and in direct contact with the inorganic compound layer;
a layer containing an organic compound provided over the first conductive layer;
a second conductive layer provided over the layer containing the organic compound to form an element; and
a second substrate having flexibility and provided over the second conductive layer,
wherein a portion of the second conductive layer is in direct contact with the inorganic compound layer through an opening in the layer containing the organic compound.

13. A semiconductor device according to claim 12, wherein the inorganic compound layer is an insulating layer.

14. A semiconductor device according to claim 12, wherein the inorganic compound layer is containing at least one of silicon oxide, silicon oxynitride, silicon nitride oxide, silicon nitride.

15. A semiconductor device according to claim 12, wherein the separation layer is formed from a layer containing at least one of tungsten, molybdenum, tungsten oxide, molybdenum oxide, tungsten oxynitride, molybdenum oxynitride.

16. A semiconductor device according to claim 12, wherein the layer containing the organic compound is a layer that changes in a crystal condition, conductivity, and a shape by applying voltage to the first conductive layer and the second conductive layer.

17. A method for manufacturing a semiconductor device according to claim 12, wherein the layer containing the organic compound includes a light emitting layer.

18. A method for manufacturing a semiconductor device according to claim 12, wherein the layer containing the organic compound is a layer generating photocurrent.

19. A semiconductor device according to claim 12, wherein an edge portion of the first conductive layer is covered with an organic insulating layer 20. A passive matrix type semiconductor device comprising the semiconductor device according to claim 12.

21. A method for manufacturing a semiconductor device according to claim 1,
wherein the portion of the second conductive layer being in direct contact with the inorganic compound layer is provided in a first region over the substrate,
wherein an another portion of the second conductive layer being in direct contact with the layer containing the organic compound is provided in a second region over the substrate, and
wherein the first region surrounds an outer edge of the second region over the substrate.

22. A method for manufacturing a semiconductor device according to claim 21, wherein the first region is continuously surrounding the outer edge of the second region.

23. A method for manufacturing a semiconductor device according to claim 21, wherein the first region is discontinuously surrounding the outer edge of the second region.

24. A method for manufacturing a semiconductor device according to claim 23, wherein the first region has any one of a rectangular shape, a circular shape, an elliptical shape and a curved shape.

25. A semiconductor device according to claim 12,
wherein the portion of the second conductive layer being in direct contact with the inorganic compound layer is provided in a first region over the substrate,
wherein an another portion of the second conductive layer being in direct contact with the layer containing the organic compound is provided in a second region over the substrate, and wherein the first region surrounds an outer edge of the second region over the substrate.

26. A semiconductor device according to claim 25, wherein the first region is continuously surrounding the outer edge of the second region.

27. A semiconductor device according to claim 25, wherein the first region is discontinuously surrounding the outer edge of the second region.

28. A method for manufacturing a semiconductor device according to claim 27, wherein the first region has any one of a rectangular shape, a circular shape, an elliptical shape and a curved shape.

* * * * *

UNITED STATES PATENT AND TRADEMARK OFFICE
CERTIFICATE OF CORRECTION

PATENT NO.        : 7,745,252 B2
APPLICATION NO.   : 11/510396
DATED             : June 29, 2010
INVENTOR(S)       : Tsunenori Suzuki et al.

It is certified that error appears in the above-identified patent and that said Letters Patent is hereby corrected as shown below:

Column 12, line 35; Change "joulolidin-" to --jololiden- --.

Column 36, line 27, claim 17; Change "A method for manufacturing a semiconductor device" to --A semiconductor device--.

Column 36, line 30, claim 18; Change "A method for manufacturing a semiconductor device" to --A semiconductor device--.

Signed and Sealed this
Fourth Day of December, 2012

David J. Kappos
*Director of the United States Patent and Trademark Office*